US012604707B2

(12) United States Patent
Choi

(10) Patent No.:  US 12,604,707 B2
(45) Date of Patent:  Apr. 14, 2026

(54) METHOD INCLUDING POSITIONING A SOURCE DIE OR A DESTINATION SITE TO COMPENSATE FOR OVERLAY ERROR

(71) Applicant: CANON KABUSHIKI KAISHA, Tokyo (JP)

(72) Inventor: Byung-Jin Choi, Austin, TX (US)

(73) Assignee: CANON KABUSHIKI KAISHA, Tokyo (JP)

( * ) Notice: Subject to any disclaimer, the term of this patent is extended or adjusted under 35 U.S.C. 154(b) by 372 days.

(21) Appl. No.: 18/491,556

(22) Filed: Oct. 20, 2023

(65) Prior Publication Data

US 2025/0132285 A1      Apr. 24, 2025

(51) Int. Cl.
*H01L 23/00*        (2006.01)
*H01L 21/66*        (2006.01)

(52) U.S. Cl.
CPC .............. *H01L 24/80* (2013.01); *H01L 22/12* (2013.01); *H01L 2224/80132* (2013.01); *H01L 2224/80895* (2013.01); *H01L 2224/80896* (2013.01)

(58) Field of Classification Search
CPC ..................... H01L 24/80; H01L 22/12; H01L 2224/80132; H01L 2224/80895; H01L 2224/80896
USPC .......................................................... 438/15
See application file for complete search history.

(56) References Cited

U.S. PATENT DOCUMENTS

| | | | |
|---|---|---|---|
| 7,550,835 B2 | 6/2009 | Kang | |
| 9,236,367 B1 | 1/2016 | Chen | |
| RE45,932 E | 3/2016 | Fujii | |
| 11,309,223 B2 | 4/2022 | Yu | |
| 11,469,217 B2 | 10/2022 | Arai | |
| 11,552,074 B2 | 1/2023 | Chen | |
| 11,631,647 B2 | 4/2023 | Haba | |

(Continued)

FOREIGN PATENT DOCUMENTS

| | | |
|---|---|---|
| WO | 2022212260 A1 | 10/2022 |
| WO | 2023056068 A1 | 4/2023 |
| WO | 2023056072 A1 | 4/2023 |

OTHER PUBLICATIONS

Muth, et al.; "Absorption Coefficient and Refractive Index Of GaN, AlN And AlGaN Alloys"; MRS Internet J. Nitride Semicond. Res. 4S1, G5.2; Cambridge Univ. Press (1999), pp. 1-6.

(Continued)

*Primary Examiner* — Dzung Tran
(74) *Attorney, Agent, or Firm* — Abel Schillinger, LLP

(57)          ABSTRACT

A method can include bonding a first source die to a first destination site of a destination substrate, wherein the first source die includes a source metrology pattern including a source alignment mark, and the first destination site includes a destination metrology pattern including a destination alignment mark. The method can include collecting radiation data regarding the source and destination metrology patterns within a radiation area. The source alignment mark does not directly overlie or directly underlie any alignment mark of the destination metrology pattern. The method can further include analyzing the radiation data to determine an overlay error between the first source die and the first destination site; and adjusting a position of a second source die or a second destination site of the destination substrate to compensate for the overlay error between the first source die and the first destination site.

21 Claims, 27 Drawing Sheets

(56)            References Cited

U.S. PATENT DOCUMENTS

| | | |
|---|---|---|
| 2021/0320038 A1 | 10/2021 | Hsu |
| 2023/0245996 A1 | 8/2023 | Sreenivasan |

OTHER PUBLICATIONS

Edmund Optics Worldwide; "The Correct Material for Infrared (IR) Applications"; accessed Sep. 13, 2023, pp. 1-5.
AdValue Technology; "Technical Information Single Crystal Sapphire"; 2015, pp. 1-4.

METHOD INCLUDING POSITIONING A SOURCE DIE OR A DESTINATION SITE TO COMPENSATE FOR OVERLAY ERROR

RELATED APPLICATION

This application is related to U.S. patent application Ser. No. 18/491,552 entitled "Method Including Positioning a Dummy Source Die or a Destination Site to Compensate for Overlay Error" by Choi filed of even date, which is assigned to the current assignee hereof and incorporated herein by reference in its entirety.

FIELD OF THE DISCLOSURE

The present disclosure relates to methods including adjusting a position a source die or a destination site to compensate for overlay error between a previously bonded source die and a different destination site.

RELATED ART

Advanced packaging technologies demand high throughput and precise placement of dies. Hybrid bonding can be particularly challenging with small misalignment tolerances. An apparatus can include a bridge and a base, where a bonding head, alignment hardware, and an alignment reference can be coupled to the bridge, and a carriage is coupled to the base. A destination substrate chuck and alignment hardware can be coupled to the carriage. During a hybrid bonding sequence, a source die is held by the bonding head, and a destination substrate is held by the destination substrate chuck. The amount of misalignment can be measured for the source die separately from the destination substrate chuck. Some compensation can be made for the misalignment but there is no end-point sensing, and overlay error may be greater than desired. A need exists for better overlay error measurement.

SUMMARY

A method can include bonding a first source die to a first destination site of a destination substrate. The first source die can include a first source active region and a first source boundary region, wherein the first source active region includes a first source active contact pad, and the first source boundary region includes a first source metrology pattern including a first source alignment mark. The first destination site can include a first destination active region and a first destination boundary region, wherein the first destination active region includes a first destination active contact pad, and the first destination boundary region includes a first destination metrology pattern including a first destination alignment mark. After bonding, the first source active contact pad contacts the first destination active contact pad. The method can further include collecting first radiation data regarding at least portions of the first source metrology pattern and the first destination metrology pattern within a first radiation area, wherein collecting the first radiation data is performed after bonding the first source die to the first destination site, and within the first radiation area, the first source alignment mark does not directly overlie or directly underlie any alignment mark of the first destination metrology pattern; analyzing the first radiation data to determine a first overlay error between the first source die and the first destination site; and adjusting a position of a second source die or a second destination site of the destination substrate to compensate for the first overlay error between the first source die and the first destination site.

In an implementation, the method further includes irradiating the first radiation area with a radiation. The first source metrology pattern includes a set of source alignment marks that includes the first source alignment mark, and the first destination metrology pattern includes a set of destination alignment marks, including the first destination alignment mark. During irradiating the first radiation area, no more than 25% of the radiation is transmitted through each alignment mark of the source alignment marks and the destination alignment marks.

In a particular implementation, irradiating the first radiation area is performed using infrared radiation.

In another implementation, the first source metrology pattern includes a set of source alignment marks, including the first source alignment mark, along a first source bonding surface, and the first destination metrology pattern includes a set of destination alignment marks, including the first destination alignment mark, along a first destination bonding surface.

In a particular implementation, none of the source alignment marks within the first source metrology pattern contacts any of the destination alignment marks within the first destination metrology pattern.

In another particular implementation, the set of source alignment marks includes a source array of dummy contact pads, wherein the first source alignment mark is a dummy contact pad within the source array of dummy contact pads. The first destination metrology pattern includes a destination array of dummy contact pads, wherein the first destination alignment mark is a particular dummy contact pad within the destination array of dummy contact pads.

In a more particular implementation, the source array is phase shifted by an angle in a range from 90° to 270° relative to the destination array.

In a further particular implementation, the method further includes irradiating the first radiation area with a radiation. Within the first radiation area, the first source metrology pattern includes a relatively non-transmissive portion with respect to the radiation and a relatively transmissive portion with respect to the radiation. The relatively non-transmissive portion of the first source metrology pattern includes the set of source alignment marks, and the relatively transmissive portion of the first source metrology pattern is disposed between the source alignment marks. The source alignment marks are only within the relatively non-transmissive portion, and no source alignment mark is within the relatively transmissive portion.

In another particular implementation, analyzing includes analyzing the first radiation data using a spatial frequency analysis.

In a more particular implementation, the first source metrology pattern, the first destination metrology pattern, or each of the first source metrology pattern and the first destination metrology pattern has a pitch and a size of a particular alignment mark corresponding to the pitch. A quotient is the pitch divided by the size of the particular alignment mark corresponding to the pitch, and the pitch and the size of the particular alignment mark corresponding to the pitch corresponds to a value in a frequency domain. The value is the quotient +/−10% of the quotient and is in a range from 1.5 to 9.0.

In another implementation, the method further includes irradiating the first radiation area with a radiation, wherein collecting radiation data is performed using a radiation detector, and wherein the radiation detector has a depth of focus of at most 9 μm.

In still another implementation, the first destination boundary region is disposed between a first dicing lane and the first destination active region. None of the first destination active region is disposed between the first dicing lane and the first destination boundary region.

In a further implementation, the method further includes bonding the second source die to the second destination site of the destination substrate, wherein the second source die includes a second source metrology pattern, and the second destination site includes a second destination metrology pattern, wherein the second source metrology pattern is identical to the first source metrology pattern, and the second destination metrology pattern is identical to the first destination metrology pattern; collecting second radiation data regarding at least portions of the second source metrology pattern and the second destination metrology pattern within a second radiation area, wherein collecting the second radiation data is performed after bonding the second source die to the second destination site; and analyzing the second radiation data to determine a second overlay error between the second source die and the second destination site.

In a particular implementation, the first overlay error is in a first direction, and the second overlay error is in a second direction that is different from the first direction.

In another particular implementation, the first overlay error is in a first direction, and the second overlay error is in a second direction that is the same as the first direction.

In a further particular implementation, the first source die and the second source die are different source dies, and the first destination site and the second destination site are different destination sites.

In a more particular implementation, the first source die and the second source die have identical electrical circuits.

In another particular implementation, determining an updated overlay error that is a sum of the first overlay error and the second overlay error.

In a further particular implementation, the method further includes testing a combination of the second source die and the second destination die using an electrical test to determine whether or not a second source active contact pad of the second source die and a second destination active contact pad of the second destination site are electrically connected to each other. The combination of the second source die and the second destination die passes the electrical test.

In a further implementation, the first source die is a bad source die, and the first destination site is at least part of a bad destination die.

In a particular implementation, the second source die is a known good source die, and the second destination site is at least part of a known good destination die.

BRIEF DESCRIPTION OF THE DRAWINGS

Implementations are illustrated by way of example and are not limited to the accompanying figures.

Figure 1:
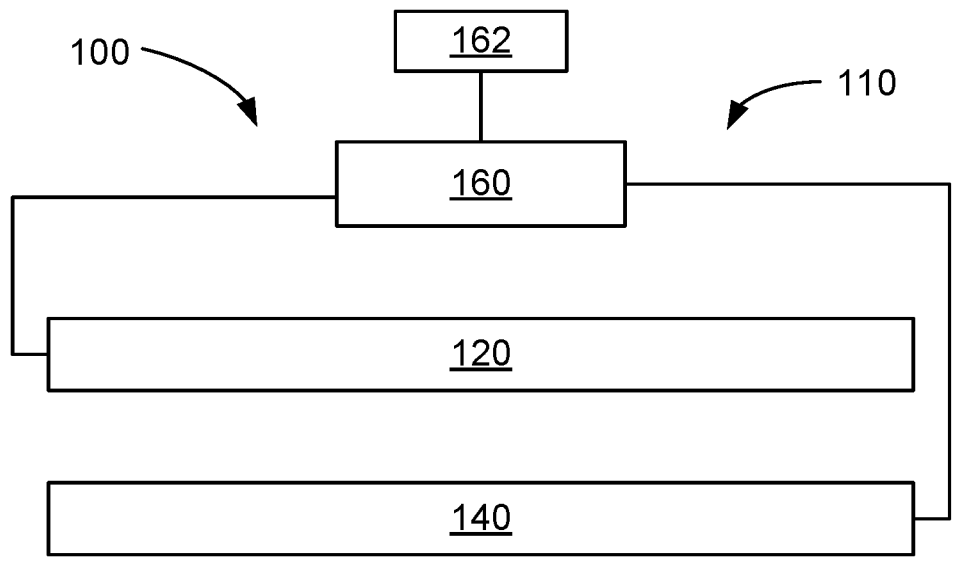
FIG. 1 includes a conceptual, high-level view of a system that can be used in transferring dies to a destination substrate.

Skilled artisans appreciate that elements in the figures are illustrated for simplicity and clarity and have not necessarily been drawn to scale. For example, the dimensions of some of the elements in the figures can be exaggerated relative to other elements to help improve understanding of implementations of the invention.

DETAILED DESCRIPTION

The following description in combination with the figures is provided to assist in understanding the teachings disclosed herein. The following discussion will focus on specific implementations of the teachings. This focus is provided to assist in describing the teachings and should not be interpreted as a limitation on the scope or applicability of the teachings.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and can be found in textbooks and other sources within the arts.

A method can include bonding a first source die to a first destination site of a destination substrate. The first source die includes a source active region and a source boundary region, wherein the source active region includes a source active contact pad, and the source boundary region includes a source metrology pattern including a first source alignment mark. The first destination site includes a destination active region and a destination boundary region, wherein the destination active region includes a destination active contact pad, and the destination boundary region includes a destination metrology pattern including a first destination alignment mark. After bonding, the first source active contact pad contacts the first destination active contact pad. The method can include collecting radiation data regarding at least portions of the source metrology pattern and the destination metrology pattern within a radiation area, wherein collecting the radiation data is performed after bonding the first source die to the first destination site. Within the radiation area, the source alignment mark does not directly overlie or directly underlie any alignment mark of the destination metrology pattern. The method can further include analyzing the radiation data to determine a overlay error between the first source die and the first destination site; and adjusting a position of a second source die or a second destination site of the destination substrate to compensate for the overlay error between the first source die and the first destination site.

The source die can be a production source die and does not need to be a dummy source die. For the source die, interconnects or other features that would otherwise interfere with collecting radiation data may not be present within any metrology pattern of the source die. In an implementation, alignment marks within the metrology patterns of the source die may reflect substantially more of the radiation as compared to other parts of the metrology pattern or may transmit substantially less of the radiation as compared to other parts of the metrology pattern of the source die.

The analysis of radiation data has many options. The analysis may or may not include generating an image. When an image is to be generated, further refinements may or may not be used to improve the image. The imaging may be performed with a range of focus that can focus on the alignment marks within the source die and the destination die and produce an image where electrical circuit elements and interconnects in the destination die are not in focus. In the same or different implementation, the imaging may be performed to produce an image where electrical circuit elements and interconnects are blurred. Pattern recognition may be used so that electrical circuit elements and interconnects below the contact pads in the destination die are not considered when determining an overlay error. Further, spatial frequency analysis performed in the spatial frequency domain can also be used when imaging or when determining the overlay error.

If needed or desired, the metrology patterns can be designed so that alignment marks within one of the metrology patterns do not overlap alignment marks within the other metrology pattern. Ideally, the alignment marks within one of the metrology patterns are 180° out of phase from the alignment marks within the other metrology pattern. The overlay error may correspond to how far alignment marks within one of the metrology patterns are away from being 180° out of phase from the alignment marks within the other metrology pattern.

The overlay error obtained for the source die and its corresponding destination site may include an X-direction overlay error, a Y-direction overlay error, a rotational overlay error, or any combination thereof. An overlay error compensation can be used for subsequent source dies that will be bonded to the destination substrate, wherein the overlay error compensation can help to reduce the overlay error for the subsequent dies. The overlay error compensation can allow for a greater overlap between the active contact pads of source KGDs to the active contact pads at the destination sites of destination KGDs of the destination substrate. The increase in overlap between active contact pads helps to reduce contact resistance.

Overlay error for more than one source die can be obtained and provide information regarding drift of an apparatus, whether or not there is center-to-edge variation or other positional relationship regarding overlay error with respect to where on the destination substrate the source die is bonded, or the like.

The methods can be performed by a system that can be in the form of an apparatus or can include a combination of an apparatus and a die loading machine or another apparatus used in hybrid bonding dies. The systems and methods of using the systems are better understood with the description below in conjunction with the corresponding figures.

Figure 2:
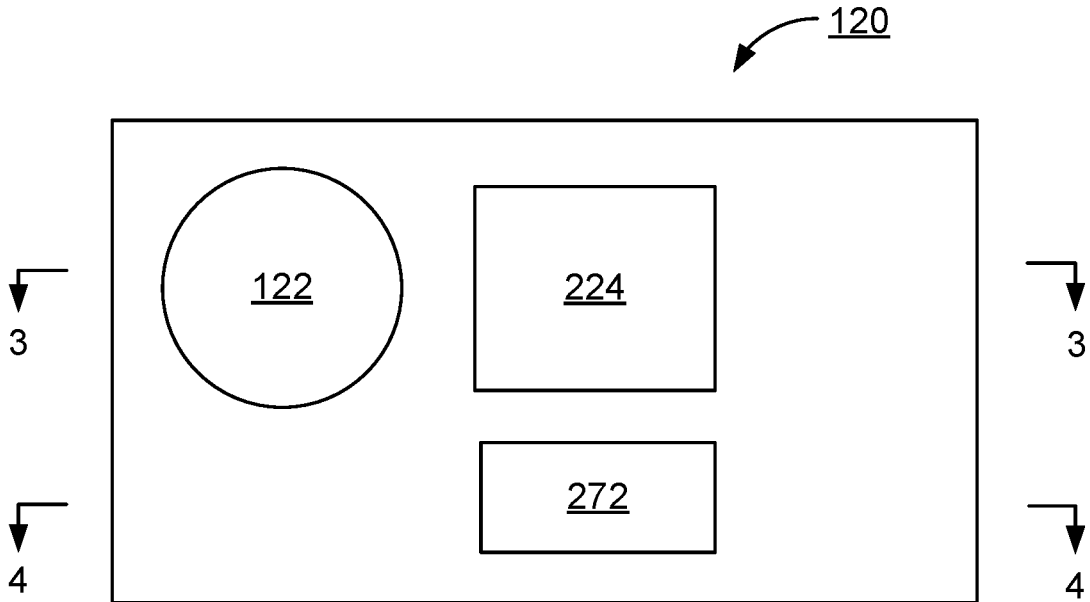
FIG. 2 includes a bottom view of a bridge of an apparatus within the system of FIG. 1.
Figure 3:
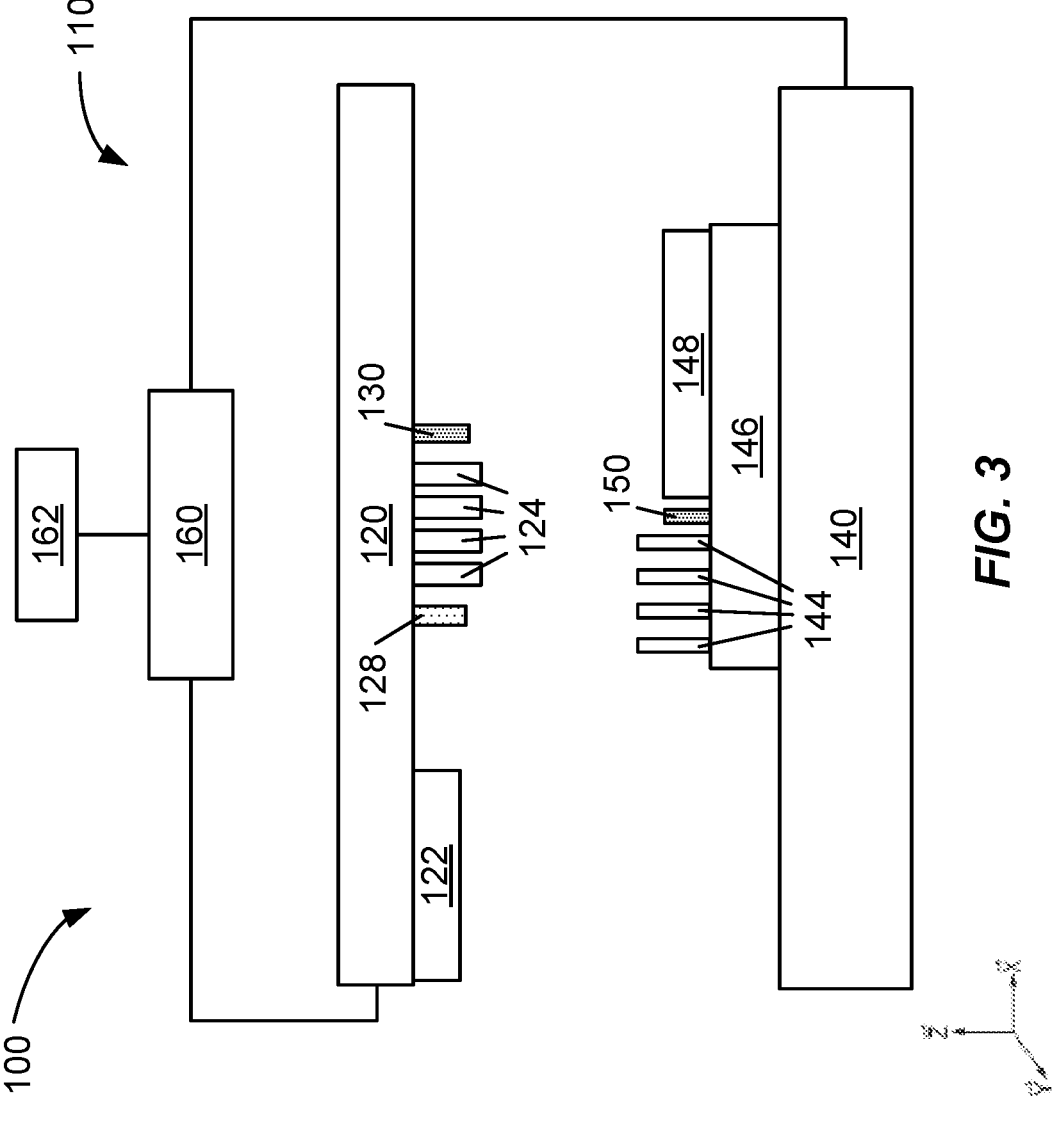
FIG. 3 includes an illustration of a cross-sectional view of the apparatus in FIG. 1 as seen along sectioning line 3-3 in FIG. 2.
Figure 4:
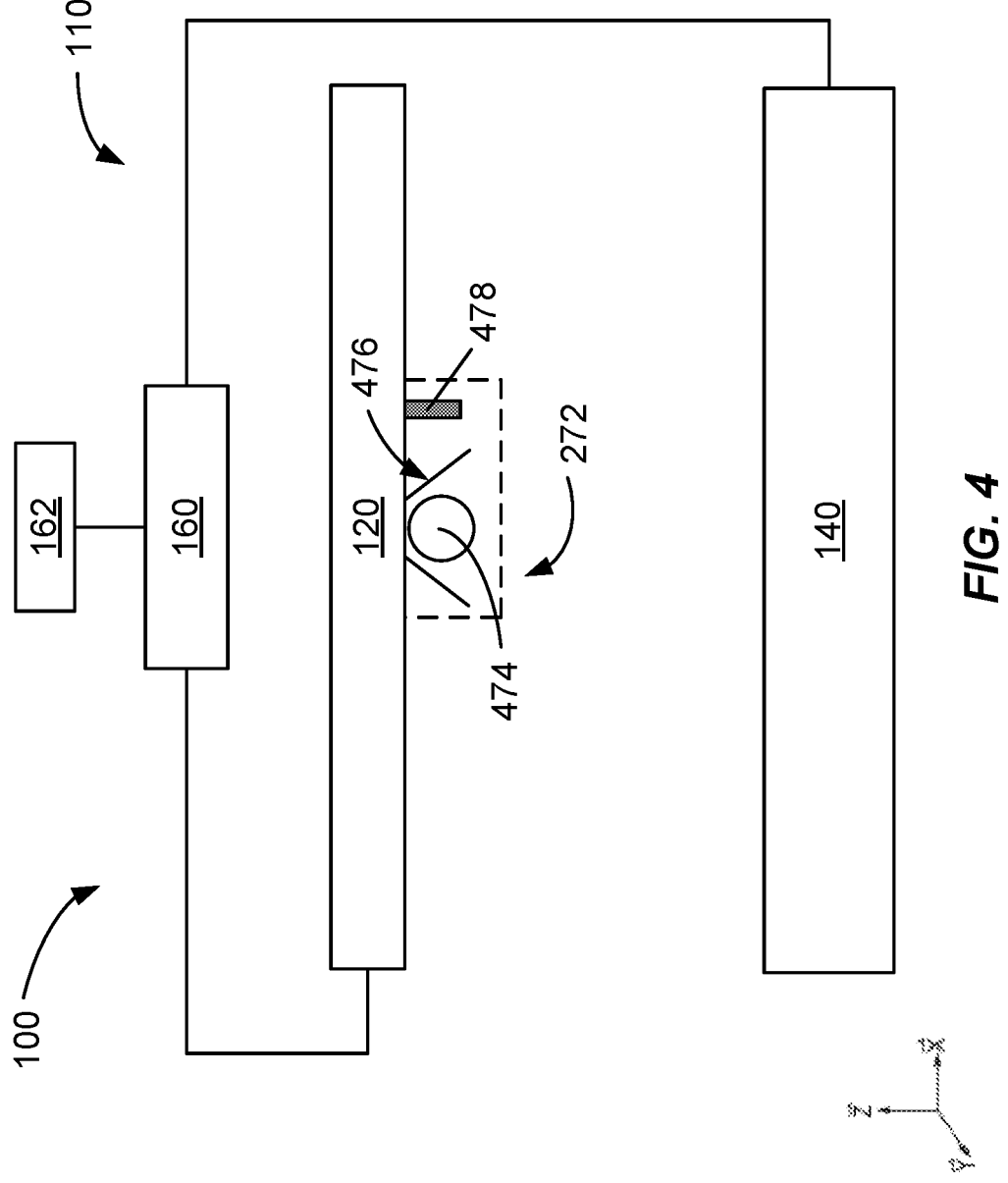
FIG. 4 includes an illustration of a cross-sectional view of a die loading machine and the apparatus in FIG. 1, wherein the apparatus is illustrated along sectioning line 4-4 in FIG. 2.

FIGS. 1 to 4 include conceptual diagrams of a system 100 that can include an apparatus 110. The system 100 can be used to transfer a plurality of dies to a destination substrate. FIG. 1 includes a high-level diagram of the system 100, and FIG. 2 includes a bottom view of a bridge 120. In FIG. 2, a sectioning line 3-3 corresponds to FIG. 3, and a sectioning line 4-4 corresponds to FIG. 4. FIG. 3 includes a cross-sectional view of the apparatus 110 to illustrate components used in transferring a plurality of dies to a destination substrate. FIG. 4 includes cross-sectional view of the system 100 that includes a radiation tool 272 within the apparatus 110. FIGS. 1 to 4 illustrate equipment making up the system 100 and does not illustrate the plurality of dies or the destination substrate. The plurality of dies and destination substrate will be illustrated with respect to process flow diagrams described later in this specification.

Referring to FIGS. 1 to 3, in an implementation, the apparatus 110 includes a bridge 120, a base 140, a controller 160, and a memory 162. The controller 160 can be coupled to the bridge 120, the base 140, one or more components coupled to the bridge 120 or the base 140, or a combination thereof. Each of the bridge 120 and the base 140 can be a support structure. The bridge 120 can be coupled to a source substrate chuck 122, an array of bonding heads 124, an alignment reference 128, and an optical component 130. The base 140 can be coupled to a carriage 146.

In FIGS. 3 and 4, the bridge 120, the base 140, and components physically coupled to the bridge 120 or the base 140 can be organized along an X-direction, a Y-direction, a Z-direction, or a combination thereof. With respect to FIGS. 3, 4, and other cross-sectional or side views in the figures, the X-direction is between the left-hand and right-hand sides of the figure, the Z-direction is between the top and bottom of the figure, and the Y-direction is into and out of the drawing sheet. Unless explicitly stated to the contrary, rotation occurs along a X-Y plane defined by the X-direction and Y-direction.

The source substrate chuck 122 can be a vacuum chuck, pin-type chuck, a groove-type chuck, an electrostatic chuck, an electromagnetic chuck, or the like. The source substrate chuck 122 can be coupled to the bridge 120 by being attached to the bridge 120 directly or can be coupled to the bridge 120 via a carriage (not illustrated). The source substrate chuck 122 has a source holding surface that faces the base 140 or a component coupled to the base 140.

FIG. 2 includes a bottom view of the bridge 120 to illustrate general locations for the source substrate chuck 122, a region 224 that includes the array of bonding heads, the alignment reference, and the optical component, and a radiation tool 272. The radiation tool 272 is addressed later in this specification.

FIG. 3 illustrates the array of bonding heads 124. The array of bonding heads 124 can be configured as a vector (a row or a column of bonding heads), or as a matrix (at least two rows and at least two columns of bonding heads), or as a staggered array. The number of bonding heads within the array of bonding heads 124 may be different between rows, between columns, or between rows and columns. Some array configurations can be 3×1, 6×1, 2×2, 2×3, 2×4, 4×2, 10×10, or another rectangular shape, where the first number corresponds to the number of bonding heads along a row or column, and the second number corresponds to the number of bonding heads along the other of the row or column.

Each of the bonding heads within the array of bonding heads 124 can include a die chuck and a body disposed between the die chuck and the bridge 120. Each of die chucks can be a vacuum chuck, pin-type chuck, a groove-type chuck, an electrostatic chuck, an electromagnetic chuck, a Bernoulli chuck, or the like. Alternatively, the die chucks can be contactless die chucks, where the die chucks contact the lateral sides, and not the device side or back side, of a die. The device side is a side of the die where electrical components are formed, the back side of the die is opposite the device side, and the lateral sides are disposed between the device and back sides of the die. When a die includes a thru-substrate via (TSV), the TSV may be exposed along the back side of the die. Contactless chucks can help to reduce the likelihood that an activated surface for bonding contacts the bonding head. In an implementation, the device side, the back side, or both the device side and back side can have activated surface(s). The lateral sides may not be activated for bonding.

The bonding heads may be configured such that the die chucks have a limited range of motion relative to their corresponding bodies to provide better positioning when dies are transferred from the array of bonding heads 124 to a destination substrate (not illustrated in FIGS. 1 to 4) coupled to a destination substrate chuck 148. Each bonding head may include a positioning stage which move each bonding head independently in one or more directions of X-direction, Y-direction, Z-direction, tip, tilt, and rotation.

Referring to FIG. 3, the alignment reference 128 is coupled to the bridge 120. The alignment reference 128 can include marks or other features that can help with proper positioning of the carriage 146 with respect to the bridge 120 or a component coupled to the bridge 120. The alignment reference 128 and an optical component 150 can be used during an alignment operation. More details regarding the optical component 150 are described below with respect to components coupled to the base 140.

The optical component 130 is coupled to the bridge 120 and can be used to determine a pitch of the array of die transfer seats 144. The optical component 130 may also be used to confirm the presence of or identity of a die (for example, a part number or type of die) coupled to a die transfer seat within the array of die transfer seats 144 or a destination substrate coupled to the destination substrate chuck 148. If needed or desired, more than one optical component 130 may be coupled to the bridge 120. The optical component 130 may also be used to determine positions of destination sites of the destination substrate coupled to the destination substrate chuck 148.

The carriage 146 is coupled to the base 140. The carriage 146 can be a positioning stage and provide translating motion along the base 140 in the X-direction, Y-direction, or Z-direction or rotational motion about one or more of axes, such as rotation about a Z-axis and along a plane lying along the X-direction and Y-direction.

The array of die transfer seats 144 are coupled to the carriage 146. The array of die transfer seats 144 have bodies and die chucks. The bodies are coupled to the carriage 146. The bridge 120 or a component coupled to the bridge 120 is closer to the die chucks than to the bodies of die transfer seats within the array of die transfer seats 144. In an implementation, any one or more of the die transfer seats can have a die chuck that can be of any type described with respect to the array of bonding heads 124. The die transfer seats and the bonding heads may be of the same type or different types. In an implementation, the die transfer seats within the array of die transfer seats 144 can be pick-up heads.

The array of die transfer seats 144 can be configured as a vector (a row or a column of pick-up heads), or as a matrix (at least two rows and at least two columns of pick-up heads), or as a staggered array. Regarding the matrix, the number of bonding heads within the array of die transfer seats 144 may be different between rows, between columns, or between rows and columns. Some array configurations can be 3×1, 6×1, 2×2, 2×3, 2×4, 4×2, 10×10, or another rectangular shape, where the first number corresponds to the number of pick-up heads along a row or column, and the second number corresponds to the number of pick-up heads along the other of the row or column.

In theory, dies from an entire source wafer may be transferred all at once. From a top view, for such a configuration, the array of die transfer seats 144 will have fewer pick-up heads along rows closer to the top and bottom of the array as compared to the row or the pair of rows closest to the center of the array, and the array of die transfer seats 144 will have fewer pick-up heads along columns closer to the left-hand side and right-hand side of the array as compared to the column or the pair of columns closest to the center of the array. After reading this specification, skilled artisans will be able to determine an array configuration for the array of die transfer seats 144 that meets the needs or desires for a particular application.

The array of die transfer seats 144 can be configured to have an adjustable pitch that can be reversibly changed between a source-matching pitch and the bonding head-matching pitch. The array of die transfer seats 144 or the carriage 146 can include motors, electrical components or the like that can be activated to move die transfer seats to achieve a desired pitch. In an implementation, the array of die transfer seats 144 can be at the source-matching pitch when picking up a set of dies coupled to the source substrate chuck 122 and at the bonding head-matching pitch when transferring the set of dies to the array of bonding heads 124. After the dies are transferred to the array of bonding heads 124, the pitch for the array of die transfer seats 144 can be changed back to the source-matching pitch before picking up more dies.

The terms "transfer operation" and "transfer cycle" are addressed to aid in understanding implementations as described herein. A transfer operation starts no later than loading a first set of dies on the array of die transfer seats 144 and ends with a last set of dies bonded to destination sites of a destination substrate overlying the destination substrate chuck 148. A transfer cycle starts no later than loading a set of dies onto the array of die transfer seats 144 until that same particular set of dies is bonded to the destination sites of the destination substrate that is coupled to the destination substrate chuck 148. A transfer operation can include one or more transfer cycles.

In an implementation, die transfer seats within the array of die transfer seats 144 do not need to be pick-up heads. The die transfer seats within the arrays of die transfer seats 144 may or may not be able to extend in the Z-direction (toward the bridge 120 or a component coupled to the bridge 120). Dies can be loaded onto die transfer seats within the arrays of die transfer seats 144 by a die loading machine. Alternatively, the dies can be loaded manually by a human operator.

The optical component 150 in FIG. 3 is coupled to the carriage 146 and can be used during alignment operations. The optical component 150 can be part of registration and alignment hardware used in aligning the carriage 146 to the alignment reference 128, identifying dies that would be held by the array of bonding heads 124, positioning bonding heads, measuring misalignment error of dies that would be held by the array of bonding heads 124, or the like. The optical component 150 can include a lens that is optically coupled to a mirror, a prism, a grating, a light source, a fiber optic cable, an aperture, a tube, a camera, or a combination thereof.

Referring to FIG. 3, the destination substrate chuck 148 can be coupled to the carriage 146 that is coupled to the base 140. In an implementation, the destination substrate chuck 148 is attached to the carriage 146. The destination substrate chuck 148 can hold a destination substrate including destination sites. The destination substrate chuck 148 can be a vacuum chuck, pin-type chuck, a groove-type chuck, an electrostatic chuck, an electromagnetic chuck, or the like. The destination substrate chuck 148 can be heated, cooled, or both heated and cooled. The destination substrate chuck 148 can include a heater (not illustrated). In the same or different implementation, a fluid (not illustrated) can flow through the destination substrate chuck 148 to increase or decrease the temperature of the destination substrate chuck 148.

Referring to FIGS. 1 to 4, the system 100 can be operated using a controller 160 in communication with the bridge 120, any component coupled to the bridge 120, the base 140, any component coupled to the base 140, or any combination thereof. The controller 160 can operate using a computer readable program, optionally stored in memory 162. The controller 160 can include a processor (for example, a central processing unit of a microprocessor or microcontroller), a field-programmable gate array (FPGA), an application specific integrated circuit (ASIC), or the like. The controller 160 can be within the apparatus 110. In another implementation (not illustrated), the controller 160 can be at least part of a computer external to the apparatus 110, where such computer is bidirectionally coupled to the system 100.

The memory 162 can include a non-transitory computer readable medium that includes instructions to carry out the actions associated with or between transfer operations. The memory 162 may include data that is used or obtained when performing the method. In another implementation, the bridge 120, a component coupled to the bridge 120, the base 140, or a component coupled to the base 140 can include a local controller that provides some of the functionality that would otherwise be provided by the controller 160.

Attention is directed to methods of using the system 100. FIGS. 5 to 8 includes a process flow diagram for a method that is described with respect to FIGS. 9 to 38. Some portions of the system 100 illustrated in FIGS. 1 to 4, such as the controller 160 and the memory 162, are not illustrated in FIGS. 9 to 38 to simplify understanding of the concepts described herein.

Figure 5:
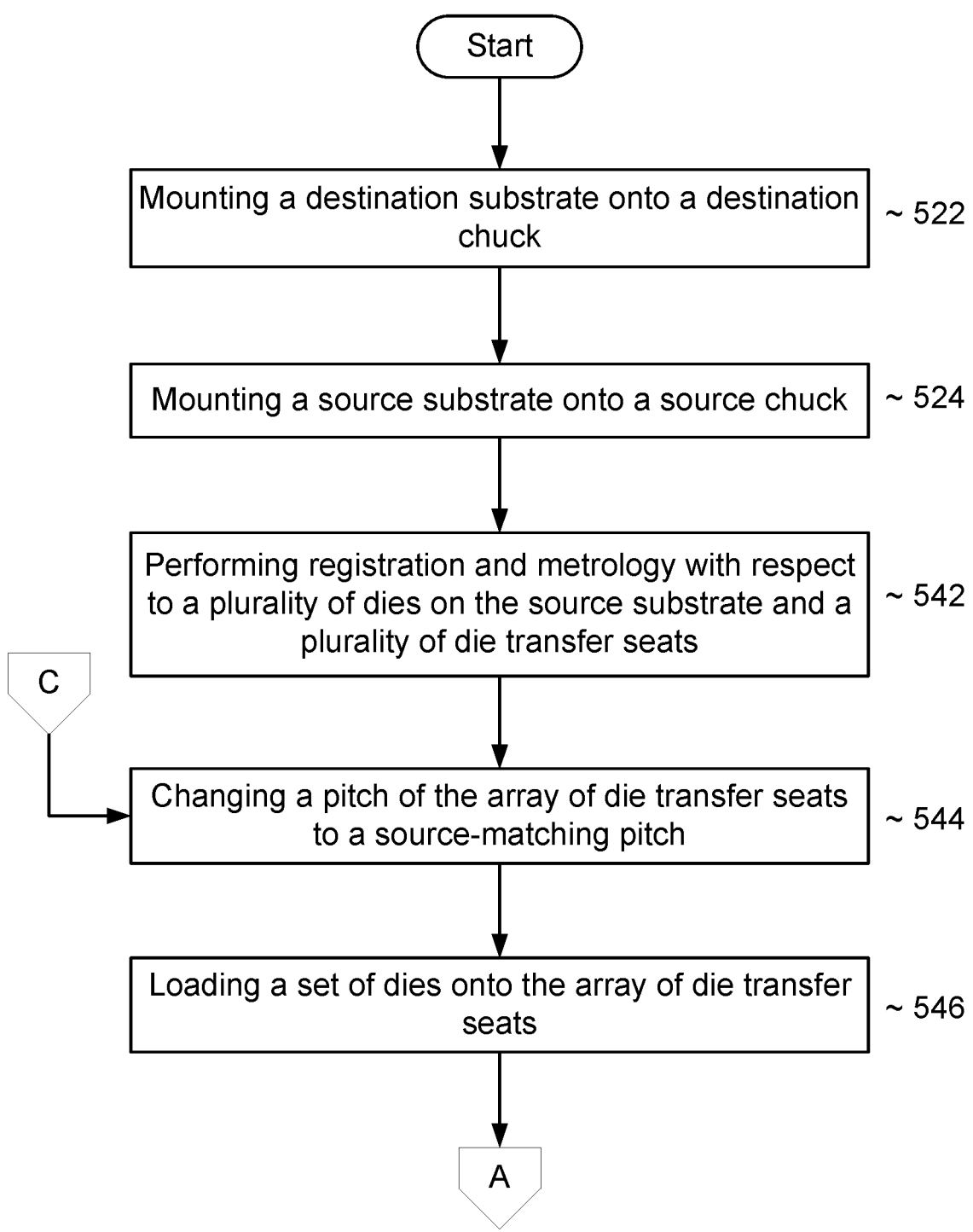
FIGS. 5 to 8 include a process flow diagram for bonding source dies to destination sites of a destination substrate and determining overlay error between the source die and its corresponding destination site.
Figure 9:
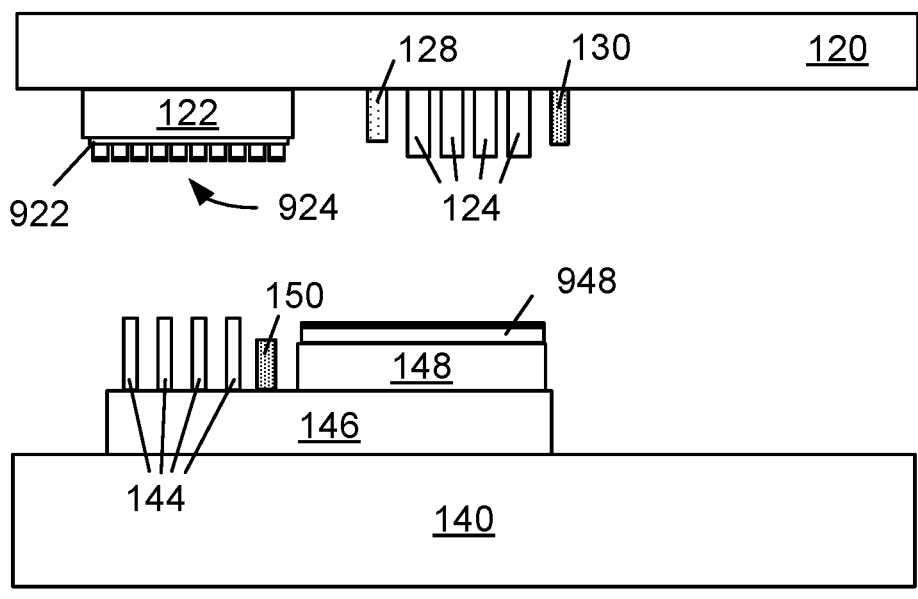
FIG. 9 includes an illustration of a cross-sectional view of a portion of the apparatus after loading a source substrate over a source substrate chuck and a destination substrate over a destination substrate chuck.

The method can include mounting a destination substrate onto a destination substrate chuck at block 522 and mounting a source substrate onto a source substrate chuck at block 524 and in FIG. 5. Referring to FIG. 9, the carriage 146 may be moved to allow easier access to the source substrate chuck 122 and destination substrate chuck 148. The actions in blocks 522 and 524 can be performed in either order.

Referring to FIG. 9, a destination substrate 948 is mounted over the destination substrate chuck 148. The destination substrate 948 can include a semiconductor wafer, a package substrate, a printed wiring board, a circuit board, an interposer, or the like. Microelectronic devices may be part of the destination substrate 948, such as a semiconductor wafer. The package substrate, the printed wiring board, the circuit board, or the interposer may or may not have dies mounted thereto. Part or all of the side of the destination substrate 948 can be activated for hybrid bonding. In an implementation, an activated surface for hybrid bonding is illustrated as a dark band along the exposed surface of the destination substrate 948.

Figure 10:
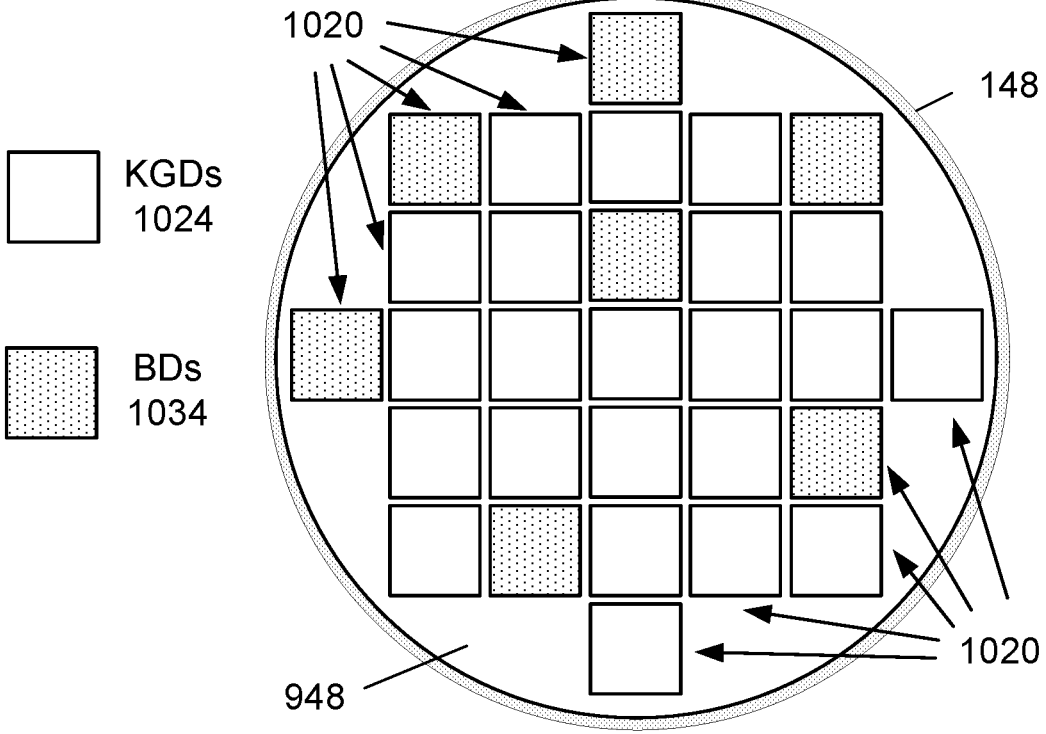
FIG. 10 includes a top view of a destination substrate chuck and the destination substrate, wherein the destination substrate includes known good dies and bad dies.

FIG. 10 includes a top view of the destination substrate chuck 148 and the destination substrate 948. The destination substrate 948 includes destination dies 1020. Any or all destination dies 1020 can include a microprocessor, a micro-controller, a graphic processing unit, a digital signal processor, a memory die (for example, a Level 2 or Level 3 cache, a flash memory, or the like), a field programmable gate array (FPGA), a power transistor die, a power circuit die, a charge coupled-device (CCD), an image sensor, a semiconductor circuit element, a die bonding location of the destination substrate, or the like.

Each of the destination dies 1020 can be a known good die (KGD) 1024 or a bad die 1034. A KGD, whether a destination die, a source die, or another die, passed one or more tests and is acceptable for bonding to another die. A bad die failed at least one test, where the test can be for electrical opens, electrical shorts, other functional testing (e.g., a process operation may not have been performed (missing an implant, an insulating layer was not formed, an etch operation was missed, or the like), the process operation may have been inadvertently performed more than one time, or the like), or the die operates too slowly (e.g., operating frequency is too low, read access time is too long, or the like)) for a particular application.

Referring to FIGS. 1 to 4 and 10, the information regarding the KGDs 1024 and bad dies 1034 and their locations with respect to the destination substrate 948 can be stored in the memory 162 or another data storage unit (e.g., a hard disk, a database, or the like) external to the system 100 for later use when determining where source dies are to be bonded to the destination substrate 948. In an implementation, all of the destination dies 1020, whether KGDs 1024 or bad die 1034, can have the circuit elements and electrical circuits including pluralities of electrical circuit elements. As used herein, an electrical circuit element can include a transistor, a resistor, a capacitor, or an inductor and does not include a conductive structure (such as a contact pad, an interconnect or a conductive plug between levels of interconnects) by itself.

Figure 11:
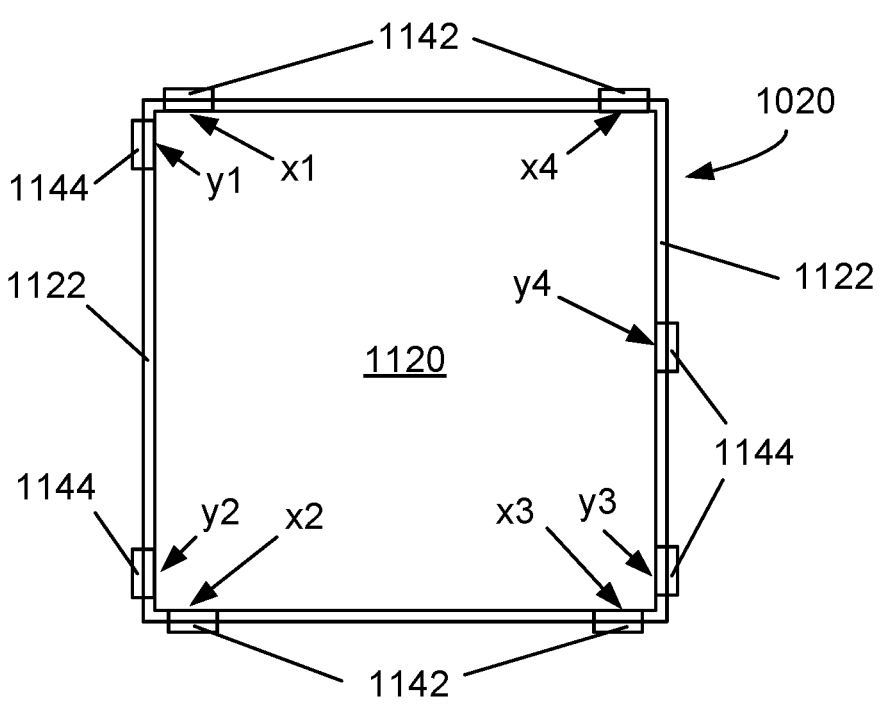
FIG. 11 includes a top view of a destination die including metrology patterns.

FIG. 11 includes a top view of one of the destination dies 1020 that includes an active region 1120 and a boundary region 1122 that surrounds the active region 1120. In an implementation, none of the active region 1120 is disposed between the boundary region 1122 and the dicing lanes. The active region 1120 includes all or nearly all of the electrical circuit elements and electrical circuits and active contact pads for the destination die 1020. As used herein, an active contact pad is electrically connected to an electrical circuit element or an electrical circuit within a die, such as the destination die 1020, a source die, or another die. An active contact pad is electrically connected to an electrical circuit element or an electrical circuit within the destination die 1020. In practice, the destination die 1020 includes many active contact pads and many electrical circuit elements and electrical circuits. The boundary region 1122 may not include any of the active contact pads for the destination die 1020.

The boundary region 1122 includes metrology patterns 1142 and 1144. The metrology patterns 1142 have lengths that extend in the X-direction (between the left-hand and right-hand sides of FIG. 11) and are noted as x1, x2, x3, and x4. The metrology patterns 1144 have lengths that extend in the Y-direction (between the top and bottom of FIG. 11) and are noted as y1, y2, y3, and y4. Each of the x1-y1 pair, the x2-y2 pair, and the x3-y3 are located near corners of the destination die 1020. Referring to x4, a corresponding pair of metrology patterns 1142 and 1144 does not need to be at a corner, and referring to y4, a metrology pattern can be spaced-apart from and a significant distance from all corners of the destination die 1020. The arrangement of metrology patterns 1142 and 1144 in FIG. 11 is exemplary and not intended to limit where the metrology patterns 1142 and 1144 are placed with respect to the boundary region 1122. After reading this specification, skilled artisans will be able to determine locations of metrology patterns to meet the needs or desires for a particular application.

In the implementation as illustrated in FIG. 11, the outer peripheral edge of the boundary region 1122 can correspond to dicing lanes when the destination substrate 948 is a semiconductor wafer and is later diced into individual destination dies 1020. The metrology patterns 1142 and 1144 may or may not extend outside of the boundary region 1122. During dicing, some of the metrology patterns 1142, some of the metrology patterns 1144, or some of both the metrology patterns 1142 and 1144 may be removed. At least portions of the metrology patterns 1142 and 1144 are present during a later radiation operation used in determining overlay error.

Figure 12:
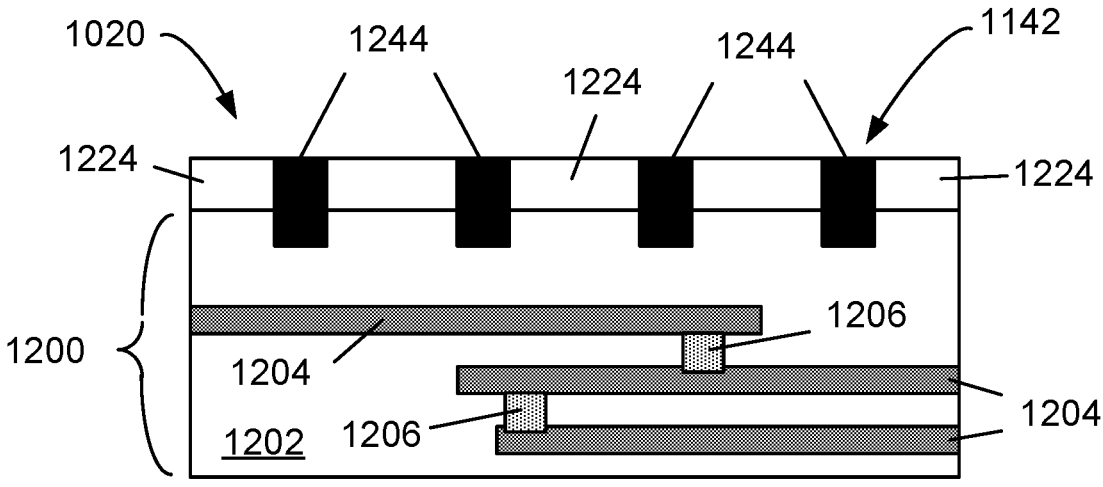
FIG. 12 includes a cross-sectional view of a portion of the destination die including alignment marks.

Each of the metrology patterns 1142 and 1144 can include alignment marks. In an implementation, the alignment marks can be arrays of contact pads. In a particular implementation, the arrays of contact pads can be arrays of dummy contact pads. As used herein, a dummy contact pad is not electrically connected to any electrical circuit element or electrical circuit of a die, such as the destination die 1020. FIG. 12 includes a cross-sectional view of a portion of the die 1020 in FIG. 11 including a portion of one of the metrology patterns 1142 that includes alignment marks 1244 that extend through a silicon oxide layer 1224 and into a substrate 1200. The arrangements of the alignment marks 1244 within the metrology patterns 1142 and 1144 as seen from a top view are illustrated and described later in this specification.

FIG. 12 includes only a portion of the substrate 1200 that can include a semiconductor base material (not separately illustrated), electronic components (not separately illustrated), an insulating layer 1202, interconnects 1204, and conductive plugs 1206. In an implementation, the substrate 1200 includes a semiconductor base material (e.g., Si, SiC, a III-V semiconductor material, a II-VI semiconductor material, or the like) and may or may not include an insulating layer, a patterned polysilicon layer, or the like overlying the semiconductor base material. In an implementation, the semiconductor material can include monocrystalline Si, polycrystalline Si, 4H—SiC, 6H-$\delta$iC, $Al_xGa_{(1-x)}N$ where $0 \leq x \leq 1$, or a combination of layers, wherein each layer within combination of layers includes one of the semiconductor materials.

The insulating layer 1202 can include a plurality of insulating layers each including an oxide, a nitride, or an oxynitride. The interconnects 1204 can be made of a metal or metal alloy, such as Al, Al-1 wt % Cu, Cu, Ag, Au, Pt, Co, W, TiW, Ti, Ta, or the like. The conductive plugs 1206 can include any of the materials described with respect to the interconnects 1204. The alignment marks 1244 can include any of the materials as described with respect to the interconnects 1204. The alignment marks 1244, the interconnects 1204, and the conductive plugs 1206 can have the same material or different materials.

Referring to FIG. 12, features other than insulating layers can underlie at least a portion of any one or more of the metrology patterns 1142 and 1144. The interconnects 1204 and the conductive plugs 1206 underlie the metrology pattern 1142. Portions of the interconnects 1204 and the conductive plugs 1206 directly underlie the alignment marks 1244 (for example, the dummy contact pads) of the metrology pattern 1142, and other portions of the interconnects 1204 and the conductive plugs 1206 do not directly underlie the alignment marks 1244 of the metrology pattern 1142. Although not illustrated, within the metrology patterns 1144, portions of other interconnects and other conductive plugs and the alignment marks 1244 and have any of the positional relationships as described with respect to the metrology pattern 1142. The terms "directly underlie" and "directly overlie" are addressed with respect to FIG. 14. In another implementation, more, fewer, or no features other than the insulating layer 1202 may directly underlie the metrology patterns 1142, 1144, or alignment marks within any one or more of the metrology patterns 1142 and 1144.

Attention is directed to a source substrate 922 and a plurality of dies 924. Referring to FIG. 9, the source substrate 922 can be mounted along the source substrate chuck 122. The plurality of dies 924 can be attached to the source substrate 922. The plurality of dies 924 can include a plurality of production source dies. As used herein, a production source die is a die that is formed during a microelectronic fabrication process and includes an electrical circuit element. The production source die may include a single electrical circuit element or may include an electrical circuit that includes a plurality of electrical circuit elements. A production source die may be a KGD or a bad die. All or only some and not all of the plurality of dies 924 are to be transferred to the destination substrate 948. The source substrate 922 can be an adhesive tape that may be in the form of a tape frame or tape reel, a container having a lattice that defines a matrix of regions that can hold the plurality of dies 924, or the like.

Any or all dies within the plurality of dies 924 can include a microprocessor, a microcontroller, a graphic processing unit, a digital signal processor, a memory die (for example, a Level 2 or Level 3 cache, a flash memory, or the like), a field programmable gate array (FPGA), a power transistor die, a power circuit die, a charge coupled-device (CCD), an image sensor, a semiconductor circuit element, or the like. All dies within the plurality of dies 924 can include identical electrical circuit element(s) and, if an electrical circuit is present, identical electrical circuit(s).

Figure 13:
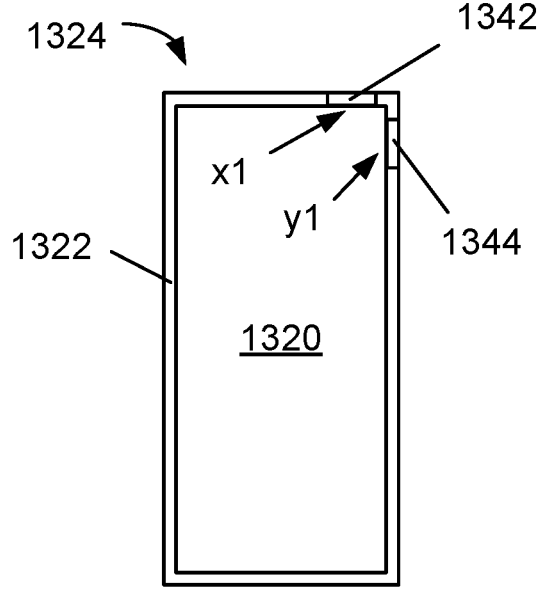
FIG. 13 includes a top view of a source die including metrology patterns.

FIG. 13 includes a top view of a source die 1324 that is a die within the plurality of dies 924. The source die 1324 includes an active region 1320 and a boundary region 1322 that surrounds the active region 1320. The active region 1320 includes all or nearly all of the electrical circuit elements and electrical circuits, interconnects, conductive plugs, and active contact pads for the source die 1324. An active contact pad is electrically connected to an electrical circuit element or an electrical circuit within the source die 1324. In practice, the source die 1324 includes many active contact pads and many electrical circuit elements and electrical circuits. The boundary region 1322 does not include any of the active contact pads for the source die 1324.

The boundary region 1322 includes metrology patterns 1342 and 1344. The metrology pattern 1342 has a length that extends in the X-direction (between the left-hand and right-hand sides of FIG. 13) and is noted as x1. The metrology pattern 1344 has a length that extends in the Y-direction (between the top and bottom of FIG. 13) and is noted as y1. The x1-y1 pair is located near a corner of the source die 1324. Similar to the metrology patterns 1142 and 1144 in FIG. 11, a corresponding pair of metrology patterns does not need to be at a corner, and a metrology pattern can be spaced-apart from and a significant distance from all corners of the source die 1324. The arrangement of metrology patterns 1342 and 1344 in FIG. 13 is exemplary and not intended to limit where the metrology patterns 1342 and 1344 are placed with respect to the boundary region 1322. After reading this specification, skilled artisans will be able to determine locations of metrology patterns to meet the needs or desires for a particular application.

In the implementation as illustrated in FIG. 13, the outer peripheral edge of the boundary region 1322 can correspond to an edge of the source die 1324 that is formed when dicing a wafer to form the plurality of dies 924. Before dicing, the metrology patterns 1342 and 1344 may or may not have extended outside of the boundary region 1322. During dicing, some of the metrology pattern 1342, some of the metrology pattern 1344, or some of both the metrology patterns 1342 and 1344 may have been removed. As illustrated in FIG. 13, least portions of the metrology patterns 1342 and 1344 are present and can be used during a later radiation operation used in determining overlay error.

Figure 14:
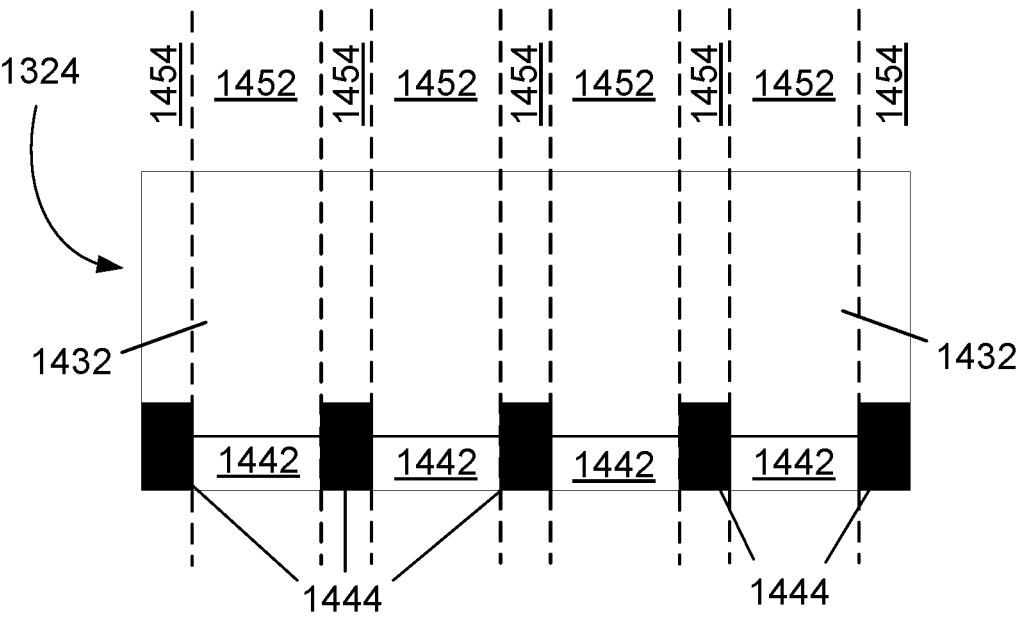
FIG. 14 includes a cross-sectional view of a portion of a source die including alignment marks.

Each of the metrology patterns 1342 and 1344 can include alignment marks. In an implementation, the alignment marks can be arrays of contact pads. In a particular implementation, the arrays of contact pads can be arrays of dummy contact pads. FIG. 14 includes a cross-sectional view of a portion of the source die 1324 in FIG. 13 including a portion of one of the metrology patterns 1342 that includes alignment marks 1444 that extend through a silicon oxide layer 1442 and into a substrate 1432.

FIG. 14 includes only a portion of the substrate 1432 that can include a semiconductor base material (not separately illustrated), an insulating layer 1442, and alignment marks 1444. In an implementation, the substrate 1432 includes a semiconductor base material (e.g., Si, SiC, a III-V semiconductor material, a II-VI semiconductor material, or the like) and may or may not include a patterned polysilicon layer, an insulating layer, such as a silicon oxide layer, a silicon nitride layer, or a silicon oxynitride layer, or the like overlying the semiconductor base material. In an implementation, the semiconductor material can include monocrystalline Si, polycrystalline Si, 4H—SiC, 6H—SiC, $Al_xGa_{(1-x)}N$ where $0 \leq x \leq 1$, or a combination of layers, wherein each layer within combination of layers includes one of the semiconductor materials. The insulating layer 1442 can include a plurality of insulating layers each including a silicon oxide, a silicon nitride, or a silicon oxynitride. The alignment marks 1444 can be made of a metal or metal alloy, such as Al, Al-1 wt % Cu, Cu, Ag, Au, Pt, Co, W, TiW, Ti, Ta, or the like. More layers may be used for the source die 1324.

In an implementation, the alignment marks 1444 can be an array of dummy contact pads. Radiation can be used during a later radiation analysis operation. The substrate 1432 and the insulating layer 1442 are relatively transmissive to radiation as compared to the alignment marks 1444, and the alignment marks 1444 are relatively non-transmissive with respect to the radiation as compared to the substrate 1432 and the insulating layer 1442.

Zones 1454 correspond to the alignment marks 1444, and zones 1452 correspond to regions between the alignment marks 1444. The zones 1452 and 1454 extend through, above, and below the source die 1324. Any object or portion of the source die 1324 that is within a particular zone 1454 and outside its corresponding alignment mark 1444 is directly above or directly below the corresponding alignment mark 1444, regardless whether or not such object or portion thereof contacts or is spaced apart from the corresponding alignment mark 1444. For example, referring to FIG. 14, a portion of the substrate 1432 along the side opposite the alignment marks 1444 and within a particular zone 1454 is directly above the corresponding alignment mark 1444 within the particular zone 1454, even through such portion of the substrate 1432 does not contact the corresponding alignment mark 1444. Such portion does not directly overlie portions of the insulating layer 1442 within the immediately adjacent zones 1452 or a different alignment mark 1444 in a different zone 1454.

Referring to FIGS. 11 to 14, each of the metrology patterns 1142, 1144, 1342, and 1344 of the plurality of dies 924, including the source die 1324, and the destination dies 1020 may include a set of dummy contact pads, and in particular, can be an array of dummy contact pads. The dummy contact pads within each of the alignment patterns 1142, 1144, 1342, and 1344 may be arranged on a rectangular, square, oblique, or hexagonal lattice, in which each lattice point in a region of the die includes a dummy contact pad. The bonding sites of the plurality of dies 924 will have an identical set of dummy contact pads to match the dummy contact pads on the destination substrate 948. The arrangement of the contact pads on each die may have a spatial frequency that is characterized by its periodicity in two directions and also the relative phases of the periodic arrangement in two directions. The phases may be relative to a fixed point on the die such as a corner of the die.

Each of the source dies within the plurality of dies 924, has a device side, which has most or all of the electrical circuit elements of the die, and a back side opposite the device side. In the implementation as illustrated in FIG. 9, the back sides of the source dies within the plurality of dies 924 are disposed between the source substrate chuck 122 and the device sides of the source dies. In another implementation, the device sides of the source dies within the plurality of dies 924 are disposed between the source substrate chuck 122 and the back sides of the source dies. The sides of the dies facing the base 140 or a component coupled to the base 140 are activated for hybrid bonding to the destination substrate 948, and the dark bands along the bottom of the source dies within the plurality of dies 924 are used to illustrate the activated surface. Any one or more of the source dies can have a through substrate via TSV or an electrical component along the back side, and such die(s) may also include back side bonding sites that may act as future destination substrate bonding sites that may be used at a later time.

Figure 15:
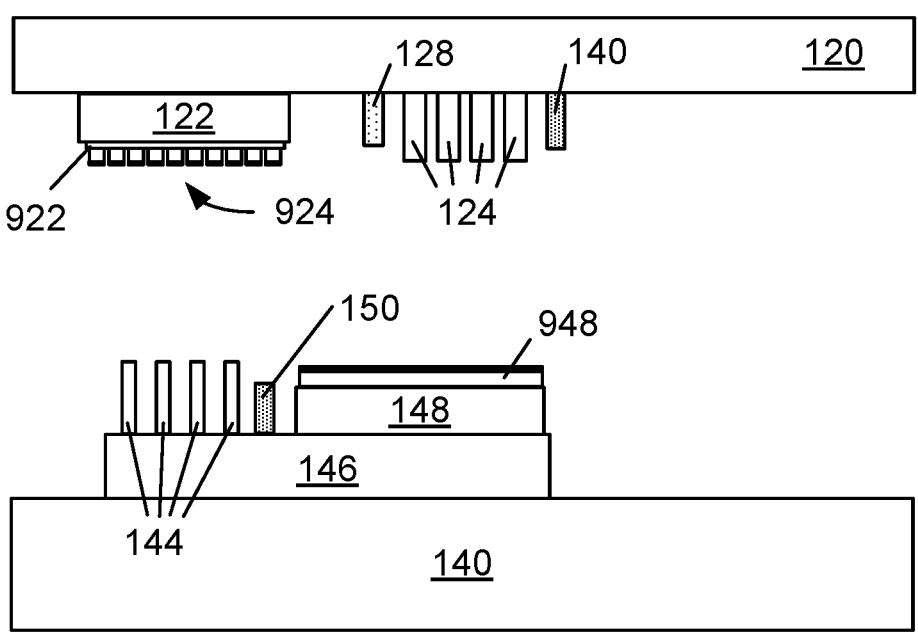
FIG. 15 includes an illustration of a cross-sectional view of a portion of the system of FIG. 1 after mounting a destination substrate and a source substrate including a plurality of source dies.

The method includes performing registration and metrology with respect to a plurality of dies on the source substrate and a plurality of die transfer seats at block 542 in FIG. 5. Referring to FIG. 15, the registration and metrology operations can be performed with respect to the plurality of dies 924 and the array of die transfer seats 144. The optical component 150 can be used to collect information regarding the plurality of dies 924. The information from the optical component 150 can be transmitted to the controller 160 or a local controller and used to determine the source pitch for the plurality of dies 924 coupled to the source substrate chuck 122. The source pitch can include an X-direction source pitch, a Y-direction source pitch, or both the X-direction and Y-direction source pitches. If needed or desired, the information may be used to identify or confirm dies within the plurality of dies 924 are in the correct relative locations for the destination sites of the destination substrate 948. The plurality of dies 924 can be production source KGDs that will be bonded to KGDs 1024 of the destination substrate 948.

The method can further include changing a pitch of the array of die transfer seats to a source-matching pitch at block 544 in FIG. 5. The source-matching pitch can be the same or within an allowable tolerance of the source pitch. Similar to the source pitch, the source-matching pitch can include an X-direction source-matching pitch, a Y-direction source-matching pitch, or both the X-direction and Y-direction source-matching pitches. The allowable tolerance may account for slight differences that can be attributed to the equipment or repeatability of a manufacturing process. As used herein, an allowable tolerance can be within 2.0%, 1.0%, or 0.5% of the desired value. For example, the source-matching pitch can be within 2.0%, 1.0%, or 0.5% of the source pitch.

The method can include loading a set of dies onto the array of die transfer seats at block 546 in FIG. 5. The set may be as little as one die or may be any number of dies up to the number of die transfer seats within the plurality of die transfer seats 144. No source die from the plurality of dies 924 has been bonded to a destination site of the destination substrate 948. There is no overlay error at this point in the method. To reduce the risk that the overlay error may be unacceptably high, one die may be bonded to the destination substrate 948. In the same or different implementation, the die may be a bad die, as opposed to a KGD. In other implementations, the die may be a KGD or the set can include a plurality of dies that may be bad dies, KGDs, or a combination of bad dies and KGDs. The description below is based on bonding one bad die during the first transfer cycle.

Figure 16:
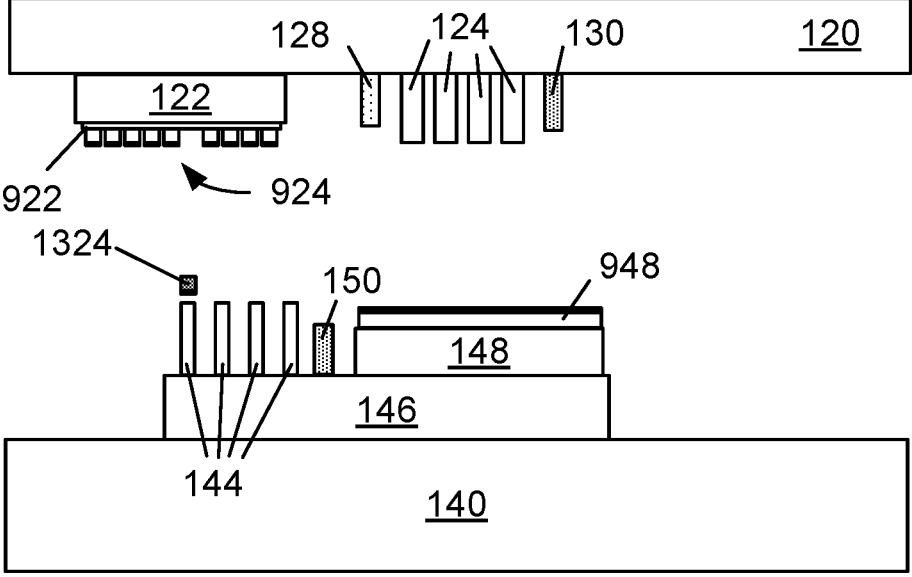
FIG. 16 includes an illustration of a cross-sectional view of a base of the system of FIG. 15 after transferring a source die to a die transfer seat.

Referring to FIG. 16, the array of die transfer seats 144 can be extended toward the source substrate 922, pick up the source die 1324, and retract the die chucks away from the source substrate 922. When the set of dies is less than the number of die transfer seats within the array of die transfer seats 144, only the die transfer seat(s) that will be picking up source die(s) during the current transfer cycle may be extended. The source die 1324 can be a production source die that is a bad die. Picking up the die is a particular type of loading. Another type of loading with respect to the system 100 can be to load any or all of the die transfer seats using a die loading machine. Within the plurality of dies 924, dies not picked up remain coupled to the source substrate chuck 122 as illustrated in FIG. 16.

In an implementation, the array of die transfer seats 144 that is used to hold the source dies does not contact the activated surfaces of the source dies. The die chucks of the array of die transfer seats 144 may be Bernoulli chucks. Although the source die 1324 is held by its corresponding die chuck, the source die 1324 is drawn in FIG. 16 as being spaced apart from its corresponding die transfer seat within the array of die transfer seats 144 to illustrate that the activated surface of the source die 1324 does not contact its corresponding die transfer seat. The array of die transfer seats 144 can have a design that allows dies to be picked up along side surfaces of dies, where the lateral side surfaces are between the device and back sides of the dies.

If a die is too thin to be held by its sides, a backing plate can be coupled to the die. For example, a die may have a thickness of less than 50 μm. A thickness of the backing plate or a combined thickness of the backing plate and die is sufficient to allow a pick-up head to pick up the backing plate or a combination of the backing plate and die without having an activated surface of the die contacting the pick-up head. The backing plate can have a thickness in a range from 100 μm to 500 μm.

The backing plate can be coupled to the source die 1324 using an adhesive compound. The backing plate may be removed at a later time or remain coupled to the die in the finished electrical device. After the die is bonded to the destination substrate 948, the backing plate may be removed. In an implementation, the adhesive compound may be deactivated by exposure to actinic radiation. The actinic radiation may be in a range from 100 nm to 1000 nm. In such an implementation, at least 70% of the actinic radiation is to be transmitted through the backing plate. In another implementation, a solvent can be used to remove the adhesive compound from between the source die 1324 and the backing plate.

In another implementation, a die may not have an activated surface but has a relatively fragile component along a surface that will be bonded to the destination substrate 948, and such surface should not contact a die transfer seat within the array of die transfer seats 144. A die transfer seat as described with respect to the die having the activated surface can be used for the die with a fragile component along the surface facing the die transfer seat.

In a further implementation, the die chucks for the array of die transfer seats 144 can have a design where the die chuck contacts the bottom-facing surface of the source die 1324. After reading this specification in its entirety, skilled artisans will be able to determine whether the array of die transfer seats 144 should or should not contact device sides or back sides of the dies and determine a design that meets the needs or desires for a particular application.

Figure 6:
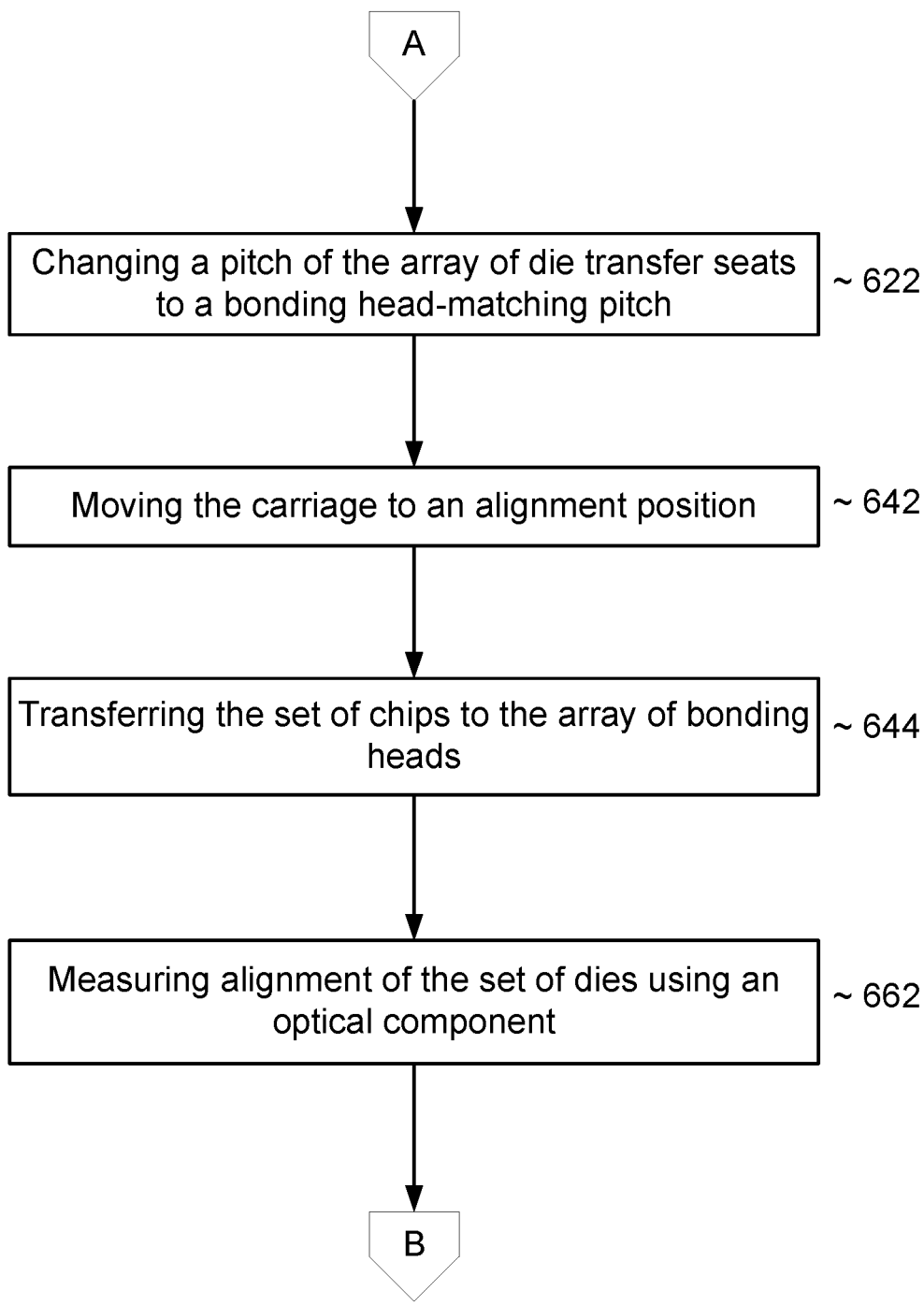

The method can further include changing a pitch of the array of die transfer seats to a bonding head-matching pitch at block 622 in FIG. 6. The bonding head-matching pitch can be the same or within an allowable tolerance of the bonding head pitch for the array of bonding heads 124. The bonding head-matching pitch and the bonding head pitch can include an X-direction bonding head-matching pitch, a Y-direction bonding head-matching pitch, or both the X-direction and Y-direction bonding head-matching pitches. For example, the bonding head-matching pitch can be within 2.0%, 1%, or 0.5% of the bonding head pitch.

Figure 17:
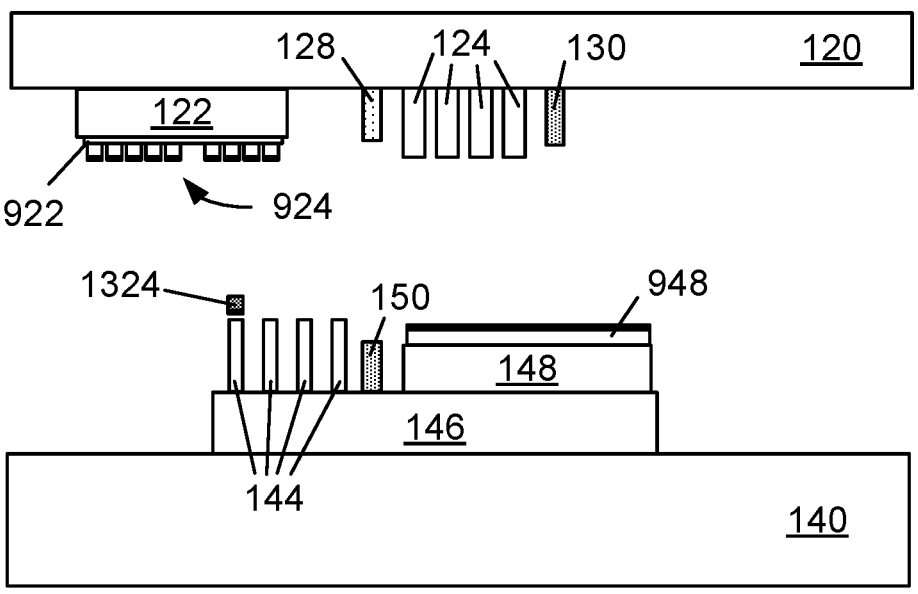
FIG. 17 includes an illustration of a cross-sectional view of the system of FIG. 16 when positioning the carriage using an optical component under an alignment reference coupled to the bridge.

The method can include moving the carriage to an alignment position at block 642 in FIG. 6. In FIG. 17, the carriage 146 is moved so that the alignment reference 128 is over the optical component 150. Information collected from the optical component 150 can be received by the controller 160 or a local controller. The controller 160 or a local controller can use the information regarding a subsequent movement of the carriage 146 to a desired location.

Figure 18:
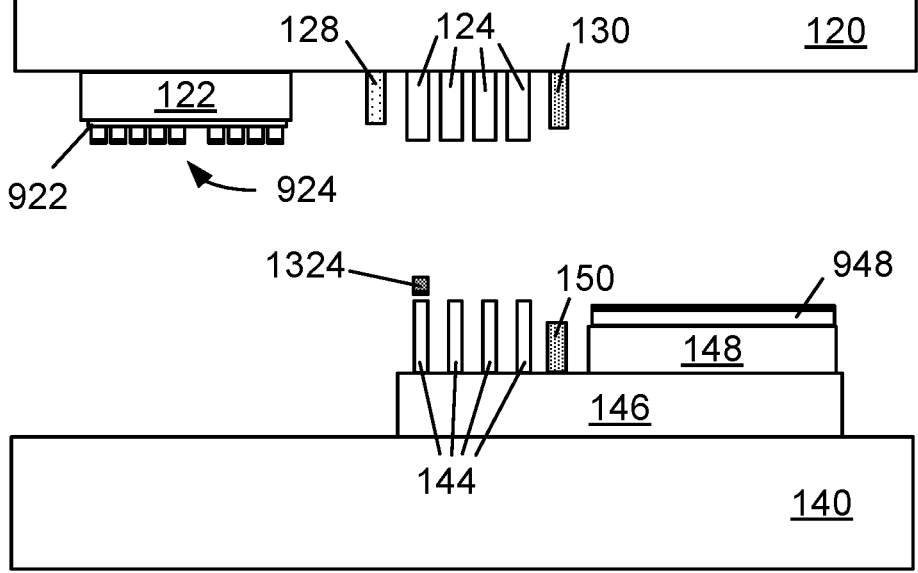
FIG. 18 includes an illustration of a cross-sectional view of the system of FIG. 17 after positioning the source die under a bonding head.

The method can further include moving the carriage 146 so that the source die 1324 can be transferred from the array of die transfer seats 144 to the array of bonding heads 124. In an implementation as illustrated in FIG. 18, the carriage 146 is moved so that a bonding head within the array of bonding heads 124 is over the source die 1324. The movement can include moving the carriage 146 in an X-direction, a Y-direction, rotating the carriage along an X-Y plane, or a combination thereof.

Figure 19:
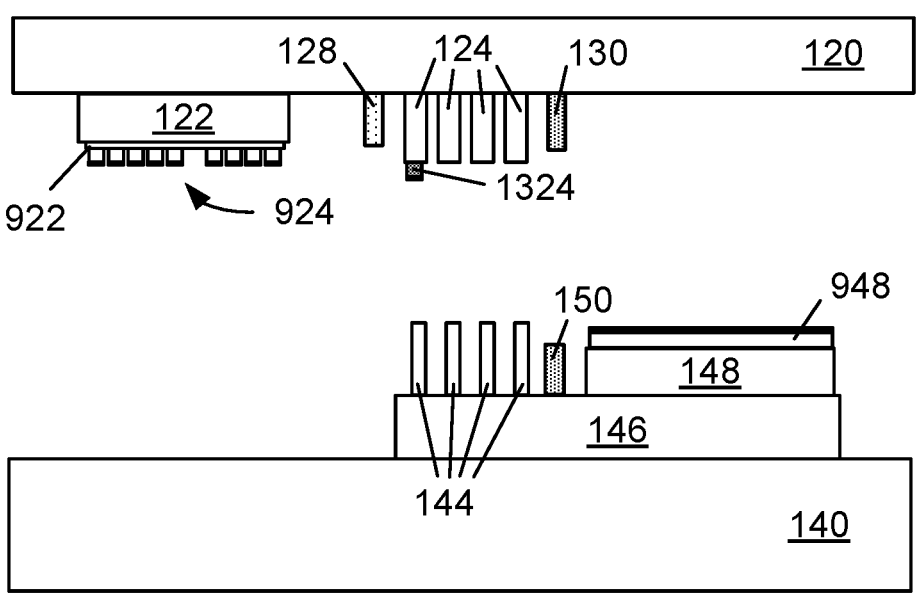
FIG. 19 includes an illustration of a cross-sectional view of the system of FIG. 18 after transferring the source die from the die transfer seat to the bonding head.

The method can further include transferring the set of dies from the array of die transfer seats to the array of bonding heads at block 644 in FIG. 6. The die chucks for the array of die transfer seats 144 can be extended toward the array of bonding heads 124, the die chucks for the bonding heads within the array of bonding heads 124 can be extended toward the array of die transfer seats 144, or both. FIG. 19 includes the source die 1324 after transferring it from the array of die transfer seats 144 to the array of bonding heads 124.

Figure 20:
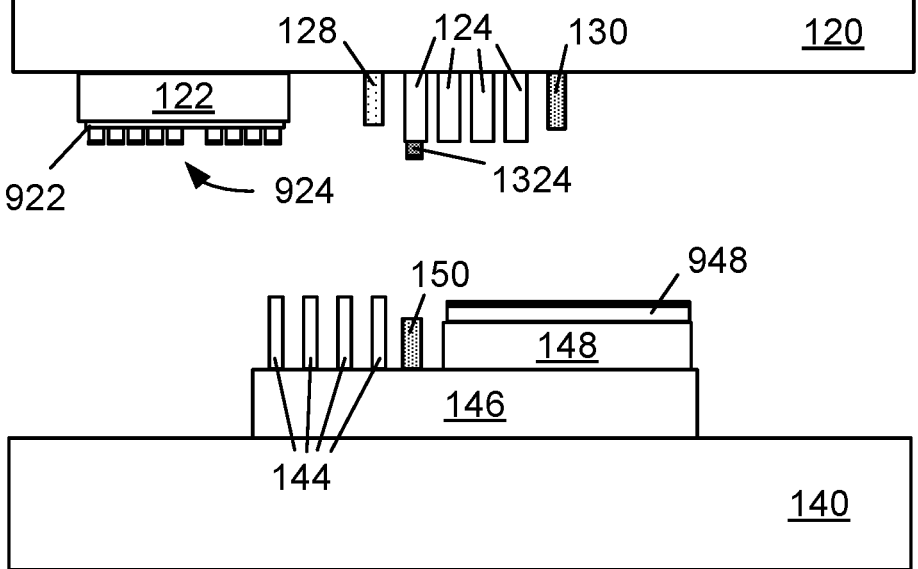
FIG. 20 includes an illustration of a cross-sectional view of the system of FIG. 19 when measuring alignment error for the source die.

The method can include measuring alignment of the set of dies using an optical component at block 662 in FIG. 6. The optical component 150 coupled to the carriage 146 may be used in positioning the source die 1324, measuring alignment error of the source die 1324, or both as illustrated in FIG. 20. Better positioning of the dies can be accomplished by measuring an alignment error as a position of each die on each bonding head relative to an ideal position of the die on the bonding head. Information from the optical component 150 can be sent to and received by the controller 160 or a local controller. The controller 160 or a local controller can use the information to determine an alignment error and an amount of positioning of the die so that the die will be more closely aligned to its corresponding destination site of the destination substrate 948. The controller 160 or a local controller can transmit a signal, so that the position of each die is adjusted by moving the die chuck of the bonding head using the limited range of motion of the die chuck relative to its corresponding body. Thus, in an implementation, moving the die chuck allows the position of the die to be adjusted relative to the destination substrate 948 that is held by the destination substrate chuck 148. Positioning and measuring alignment error may be performed iteratively until the alignment error is zero or an acceptably low value.

Figure 7:
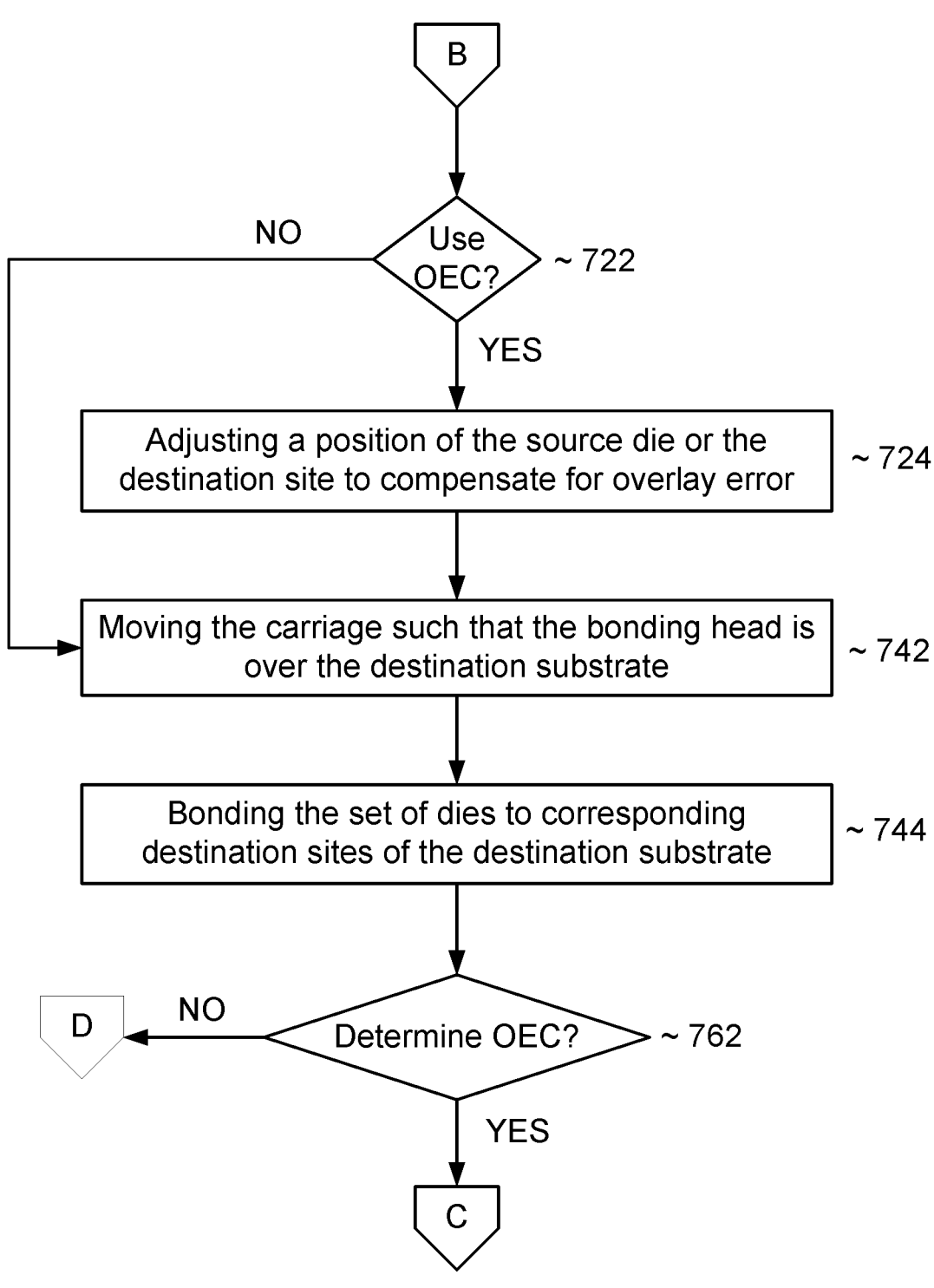

The method includes deciding whether or not to use an overlay error compensation (OEC) at decision diamond 722 in FIG. 7. Because the source die 1324 will be the first die within the plurality of dies 924 to be bonded to the destination substrate 948, no overlay error has been determined. The method proceeds along the "NO" branch of the decision diamond 722.

Figure 21:
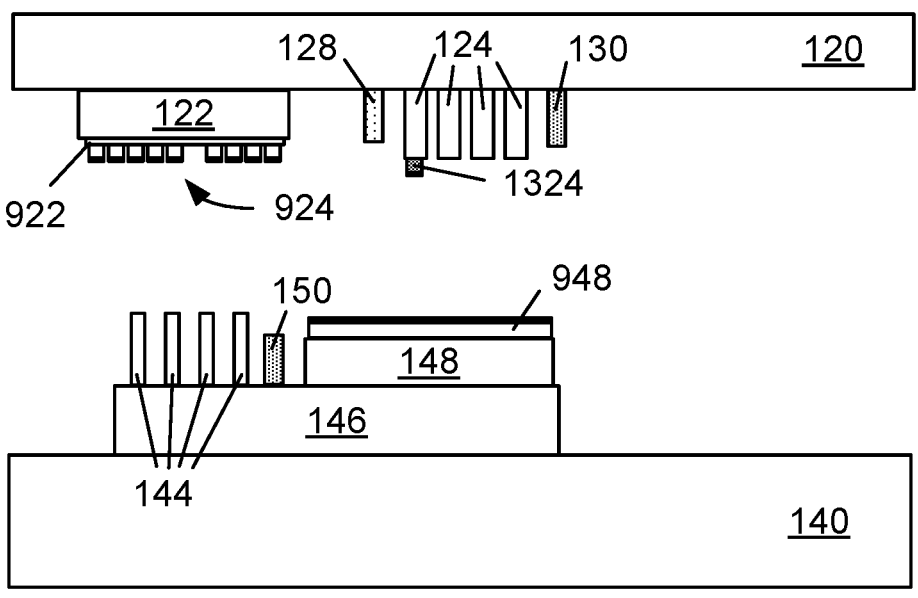
FIG. 21 includes an illustration of a cross-sectional view of the system of FIG. 20 after positioning the source die over the destination substrate.

The method further includes moving the carriage such that the bonding head is over the destination substrate at block 742 in FIG. 7. In FIG. 21, the carriage 146 is moved so that the source die 1324 is over its corresponding destination site for the destination substrate 948.

The method can further include bonding the set of die to corresponding destination sites of the destination substrate at block 744 in FIG. 7. The die chuck for the bonding head within the array of bonding heads 124 can be extended toward the destination substrate 948, the destination substrate chuck 148 can be extended toward the array of bonding heads 124, or both. Pressure is exerted to bond the source die 1324 to its corresponding destination site of the destination substrate 948 in FIG. 22. In an implementation, the bond can be an oxide-to-oxide bond. The pressure during bonding can be in a range 0.5 N/cm$^2$ to 20 N/cm$^2$. The bonding can be performed at room temperature (for example, at a temperature in a range from 20° C. to 25° C.) or higher. Bonding is performed at a temperature less than a subsequent anneal to expand conductive metal within the dies and at the destination sites. The temperature and pressure may be limited depending on films present during bonding or components within the apparatus 110. For example, the temperature may be no higher than approximately 200° C. After reading this specification, skilled artisans will be able to determine the pressure and temperature used for bonding.

Figure 23:
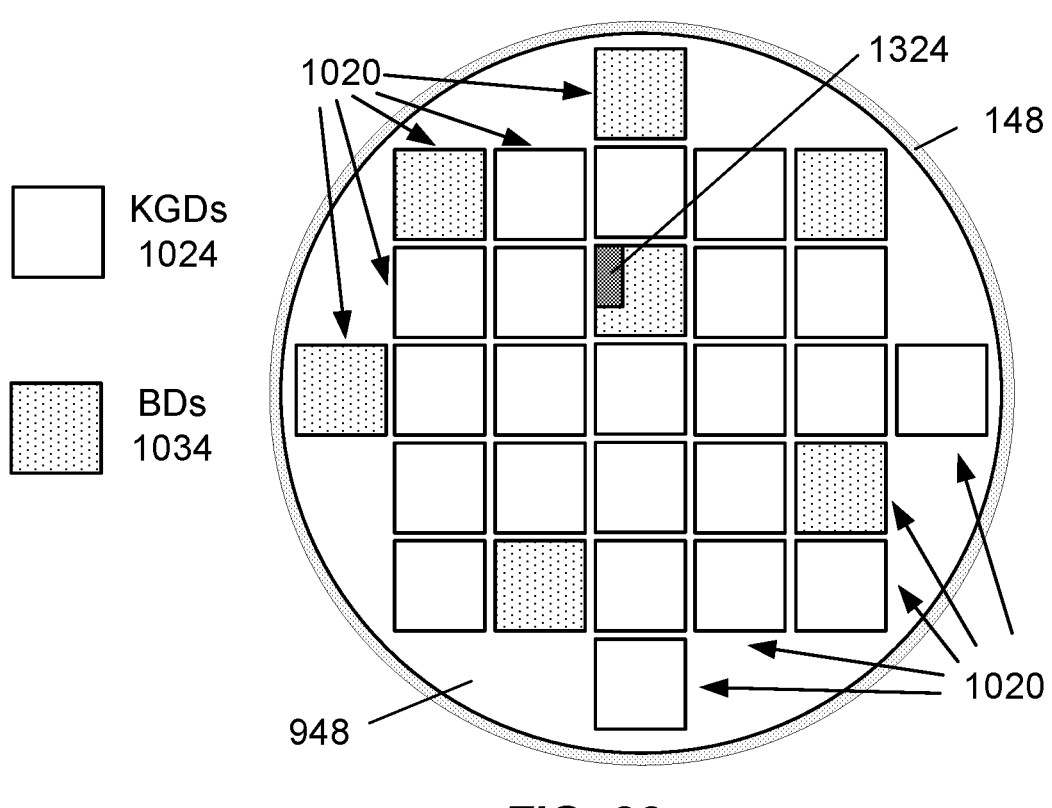
FIG. 23 includes an illustration of a top view of the destination substrate chuck and the destination substrate of the system of FIG. 22 after bonding the source die to the destination site.

FIG. 23 includes a top view of the destination substrate chuck 148 and the destination substrate 948 after the source die 1324 is bonded to its corresponding destination site of the destination substrate 948. To maintain high yield for the destination substrate 948, the source die 1324, which is a bad die in this particular example, can be bonded to a bad die 1034 of the destination substrate 948. Referring to FIGS. 11, 13, and 23, the source die 1324 is bonded to the upper left-hand corner of the bad die 1034. The source die 1324 includes the x1-y1 pair of the metrology patterns 1342 and 1344 that are complementary to the x1-y1 pair of the metrology patterns 1142 and 1144 of the bad die 1034.

Figure 24:
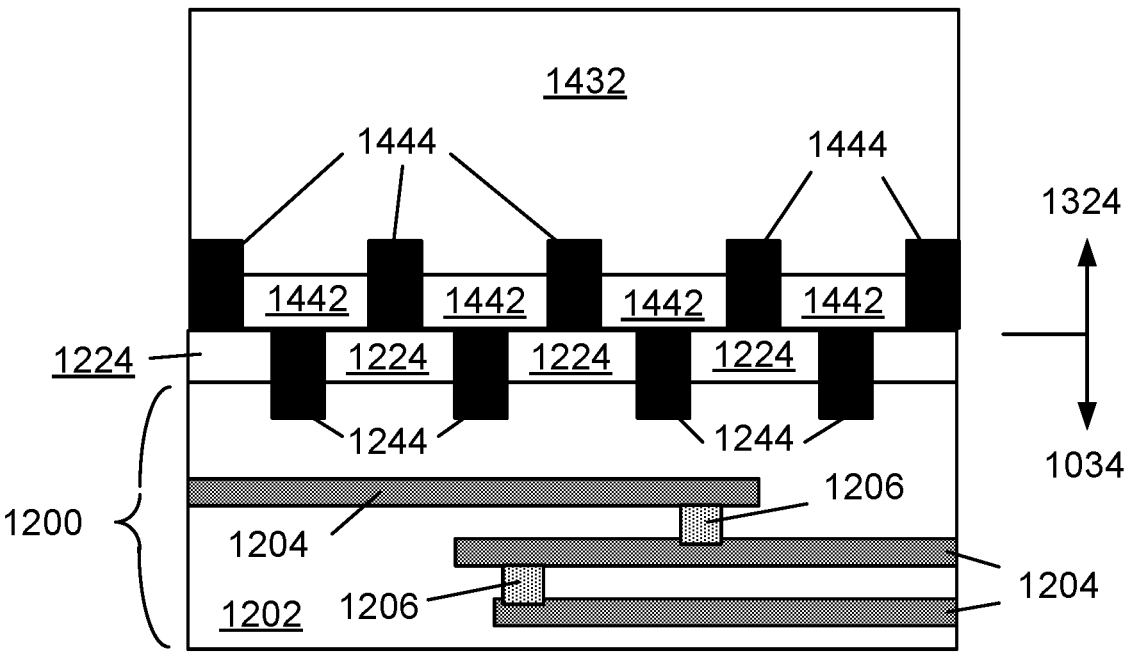
FIG. 24 includes a cross-sectional view of portions of the source die and the destination die at metrology patterns of the dies.

FIG. 24 includes a cross-sectional view of portions of the source die 1324 and the bad die 1034 at metrology patterns of the dies. Alignment marks 1444 for the source die 1324 can be at the bonding surface and contact the bad die 1034, and alignment marks 1244 for the bad die 1034 can be at the bonding surface and contact the source die 1324. The alignment marks do not need to be at the bonding surfaces. For example, the alignment marks 1444 in the source die 1324 can be spaced apart from the bonding surface by at least part of the insulating layer 1442, so that the alignment marks 1444 do not contact the bad die 1034. Similarly, the alignment marks 1244 of the bad die 1034 can be spaced apart from the bonding surface and not contact the source die 1324. In the implementation as illustrated, the alignment marks 1444 of the source die 1324 are spaced apart from and do not contact any of the alignment marks 1244 of the bad die 1034, and the alignment marks 1244 of the bad die 1034 are spaced apart from and do not contact any of the alignment marks 1444 of the source die 1324.

The method includes deciding whether or not to determine an OEC at decision diamond 762 in FIG. 7. Because the source die 1324 is the first die from the plurality of dies 924 to be bonded to the destination substrate 948, an overlay error compensation can be determined. The method proceeds along the "YES" branch at the decision diamond 762.

Figure 8:
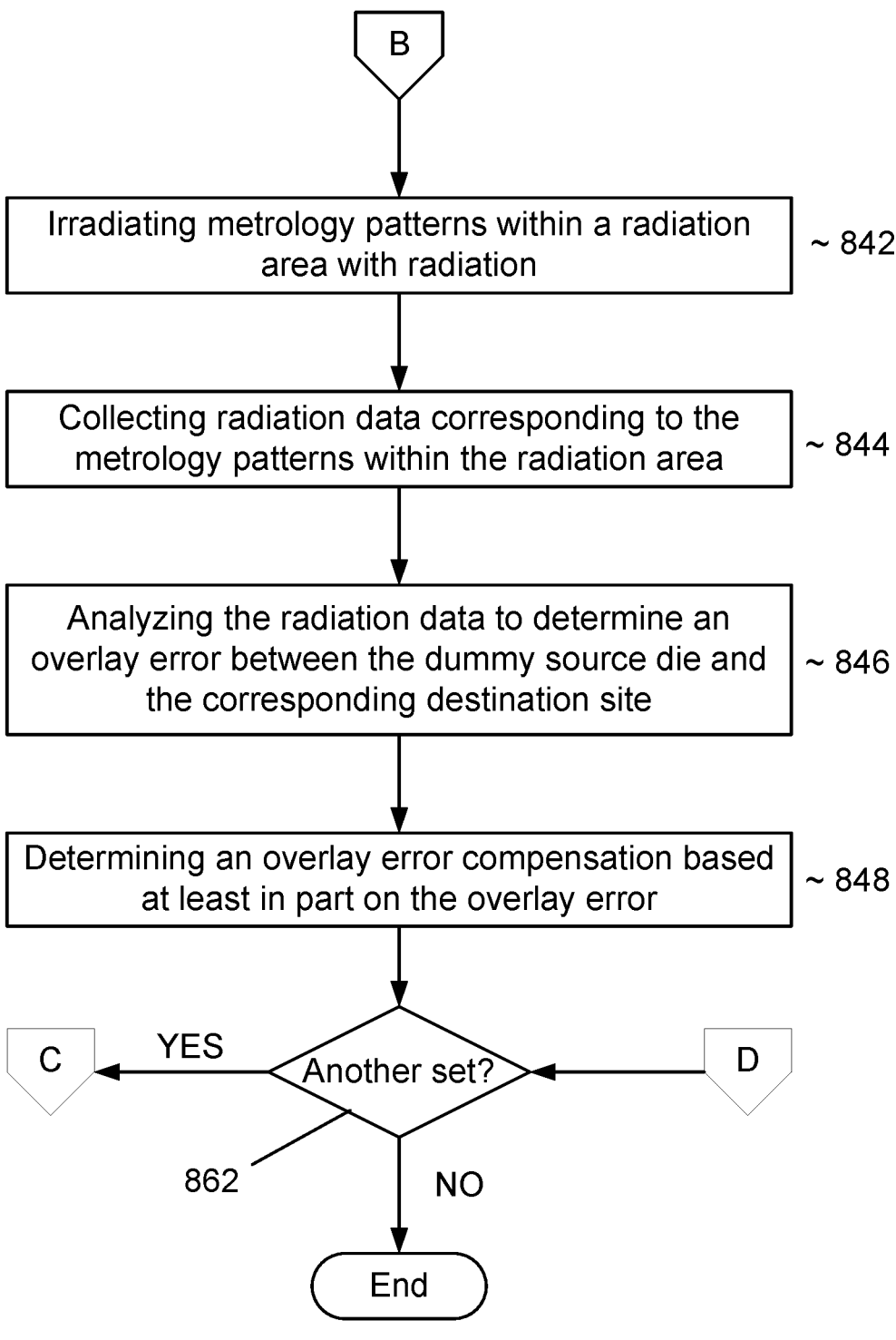
Figure 25:
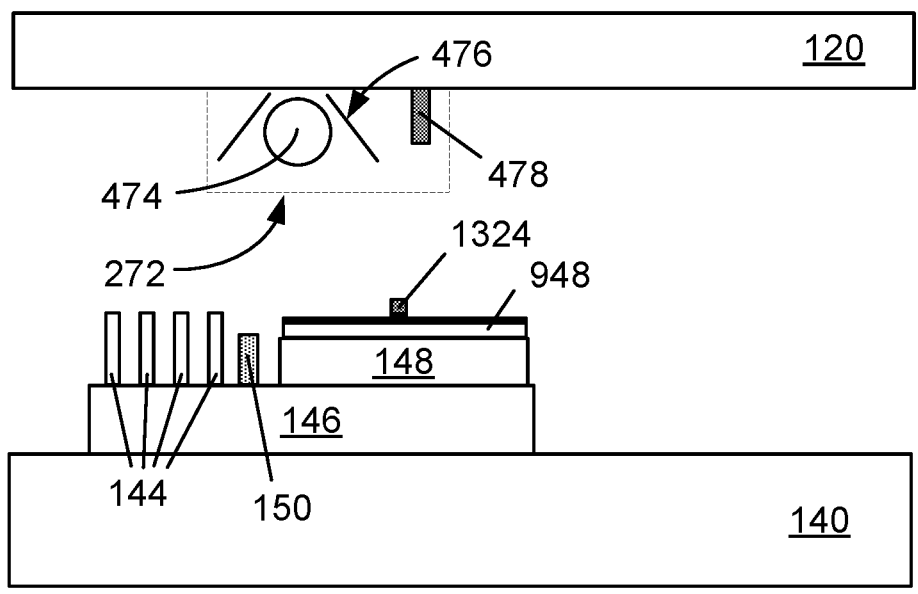
FIG. 25 includes an illustration of a cross-sectional view of the system as illustrated in FIGS. 1, 2, and 4 when collecting radiation data related to the source die and the destination site.

The method can include irradiating metrology patterns within a radiation area with radiation at block 842 and collecting radiation data corresponding to the metrology patterns within the radiation area at block 844 in FIG. 8. FIG. 25 includes a cross-sectional view at this point in the method. The radiation tool 272 includes the radiation source 474, the reflector 476 and the radiation detector 478.

Radiation emitted by the radiation source 474 can be reflected by some components within metrology patterns within the source die 1324 and the destination site of the destination substrate 948. In this example, the destination site is part of the bad die 1034. The reflected radiation can be received by the radiation detector 478. In the same or different implementation, the radiation source 474 may be absorbed and cause some components within the source die 1324 or the destination site of the destination substrate 948 to fluoresce, phosphoresce, or produce ionized radiation, and the radiation detector 478 can detect the fluorescence, the phosphorescence, or the ionized radiation emitted by such components. Thus, the radiation detector 478 may detect the same or a different form of radiation as emitted by the radiation source 474. For the purposes of this specification, a component within the plurality of dies 924 or the destination site of the destination substrate 948 that fluoresces, phosphoresces, or produces ionized radiation in response to being irradiated by the radiation is a type of non-transmissive component.

In another implementation, radiation can be transmitted through the source die 1324 and the destination substrate 948 may be detected by a radiation detector within the destination substrate chuck 148, the carriage 146, the base 140, or another suitable portion of the system 100. Similar to the radiation detector 478, the radiation detector for the transmitted radiation may detect the same type of radiation emitted by the radiation source 474 or another form of radiation, such as fluorescence, phosphorescence, or ionized radiation.

The radiation can be selected so that the source die 1324 includes relatively non-transmissive portions and relatively transmissive portions. As previously described, the alignment marks 1244 and 1444 can include a metal or metal alloy that absorbs, reflects, or absorbs and reflects the radiation more than the insulating layer 1442 and the substrate 1432, where the substrate 1432 can include a semiconductor material, an insulating layer, or a combination thereof. The non-transmissive portions can be the alignment marks 1444 that are dummy contact pads, and the relatively transmissive portions can include the insulating layer 1442 and the substrate 1432. In an implementation, the radiation can be infrared radiation (IR) and have a wavelength in a range from 0.7 μm to 1000 μm and, in a particular implementation, from 1 μm to 10 μm or from 1 μm to 2 μm.

The radiation detector 478, the radiation detector within the destination substrate chuck 148, the carriage 146, the base 140, or another suitable portion of the system 100, or another component coupled to the radiation tool 272 can collect at least some radiation data. The radiation data can include the measurements of intensities of radiation detected and locations where such intensities were detected. If the radiation detector 478 does not collect location information, such location information may be obtained from the carriage 146 or another suitable component within the system 100.

Figure 26:
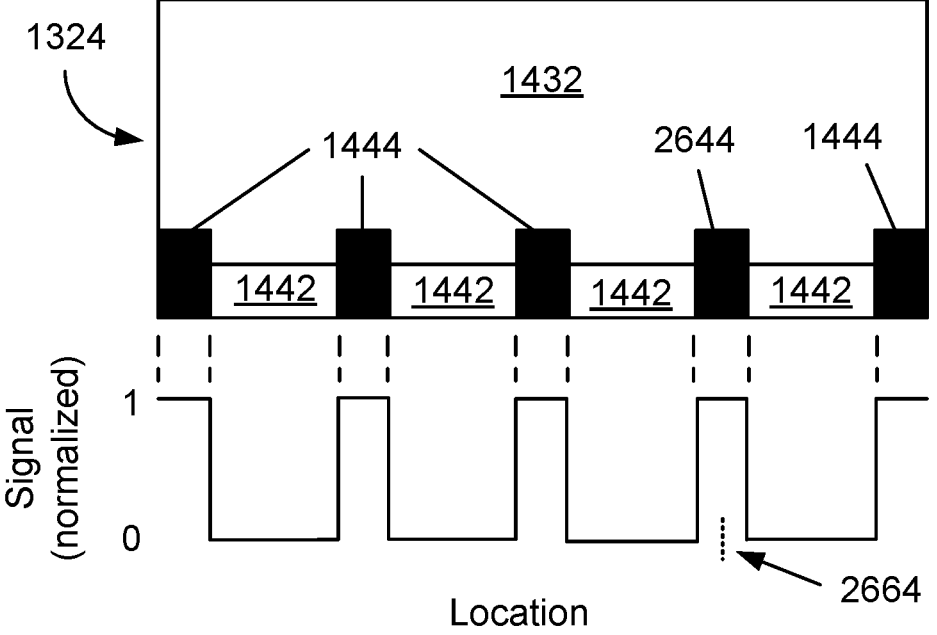
FIG. 26 includes an illustration of a portion of the source substrate within a radiation area and radiation data corresponding to the portion of the source die.

FIG. 26 includes exemplary radiation data and location information that can be collected relative to the source die 1324. Referring to FIGS. 25 and 26, the detected signal from the radiation detector 478 is normalized using only the locations with the alignment marks 1444 and locations between the alignment marks 1444 and 2644. The alignment mark 2644 is a particular alignment mark and is one of the alignment marks 1444. Most of the radiation from the radiation source 474 may be reflected by the alignment marks 1444 and has a value of 1 in FIG. 26, and substantially less radiation is reflected within locations between the alignment marks and has a value of 0 in FIG. 26. In practice, not all radiation is reflected by the alignment marks 1444 and at least some radiation may be reflected by the combination of the substrate 1432 and the insulating layer 1442.

Figure 27:
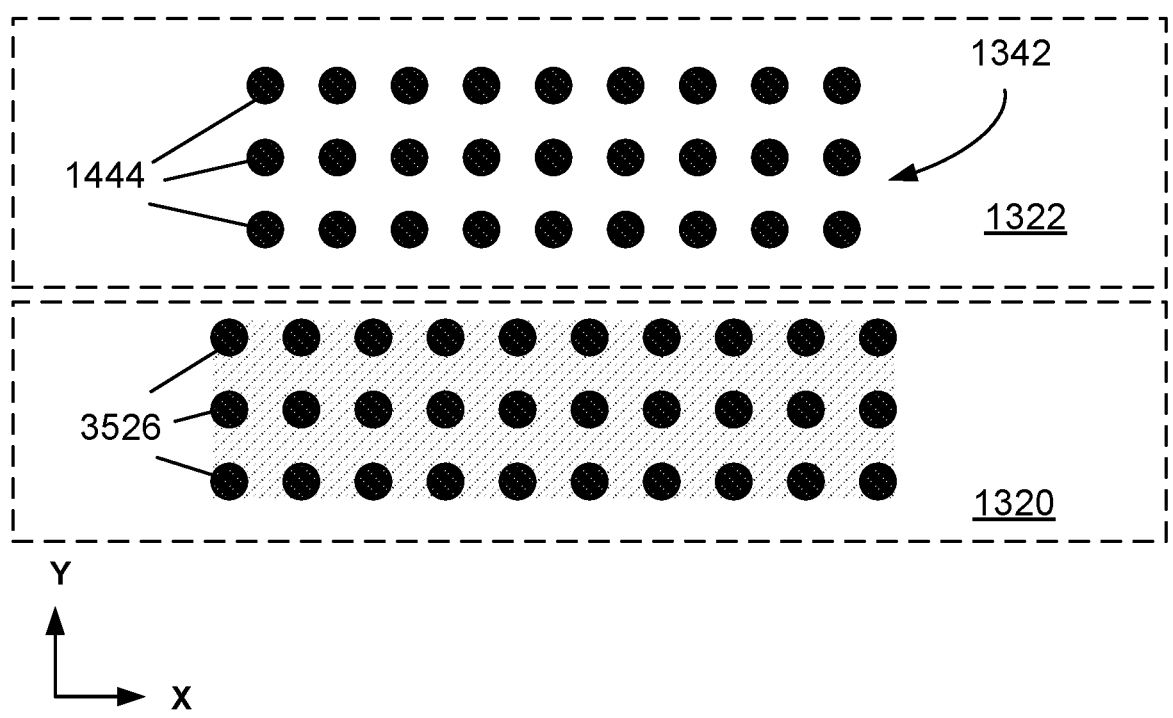
FIG. 27 includes an illustration of a X-direction metrology pattern of the source die.
Figure 28:
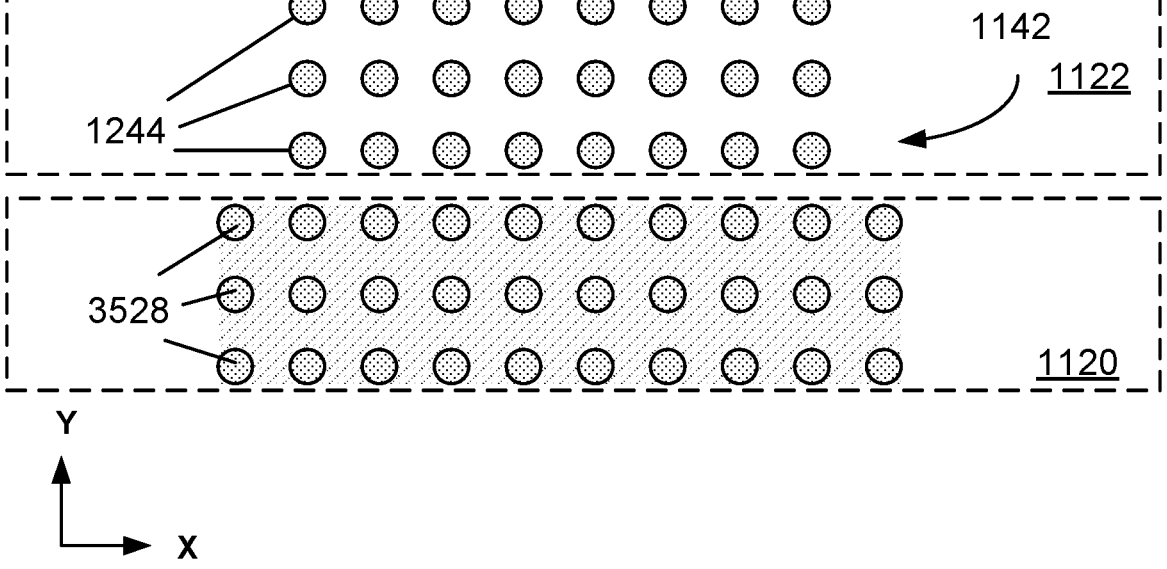
FIG. 28 includes an illustration of a X-direction metrology pattern of the destination die.
Figures 29, 30:
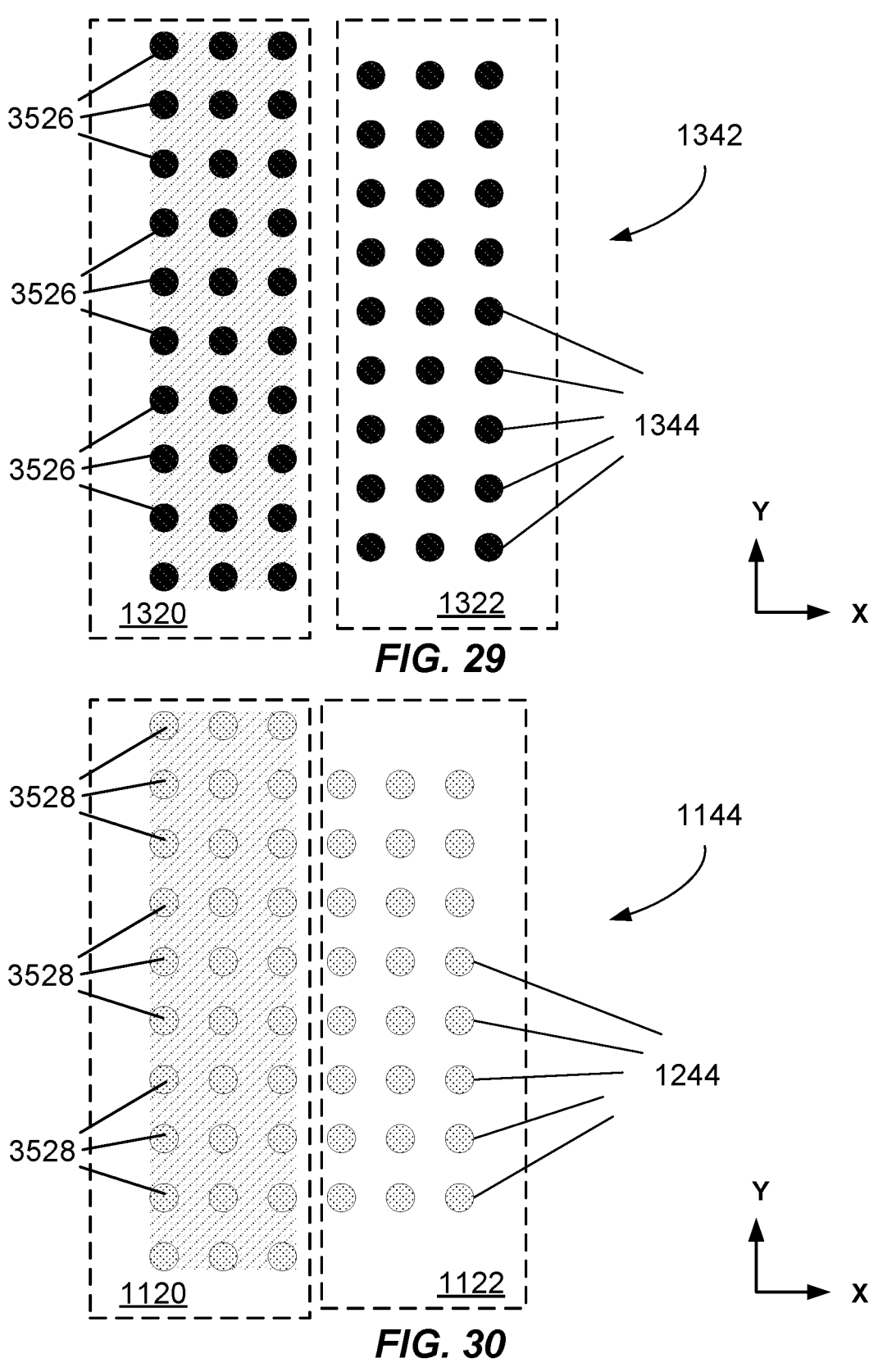
FIG. 29 includes an illustration of a Y-direction metrology pattern of the source die.
FIG. 30 includes an illustration of a Y-direction metrology pattern of the destination die.

Metrology patterns 1142 of the destination site and the metrology pattern 1342 for the source die 1324 is described with respect to FIGS. 27 and 28, and metrology patterns 1144 of the destination die 1020 and the metrology pattern 1344 for the source die 1324 are described with respect to FIGS. 29 and 30. After reading this specification in its entirety, skilled artisans will understand that the metrology patterns illustrated in FIGS. 27 to 30 are exemplary and do not limit the shape or size of features and spacings between the features for other metrology patterns.

FIG. 27 includes a top view of the X-direction metrology pattern 1342 of the source die 1324 in a boundary region 1322 adjacent to a portion of the active region 1320. The alignment marks 1444 may be 180 degrees out of phase with the active contact pads 3526 in the active region 1320, also the active region 1320 has underlying features that may interfere with the imaging of the active contact pads 3526 or any other alignment features in the active region. FIG. 28 includes a top view of the X-direction metrology pattern 1142 of the destination site in a boundary region 1122 adjacent to another portion of the active region 1320. The alignment marks 1244 are arranged in phase with the active contact pads 3528 in the active region 1120 also the active region 1120 has underlying features that may interfere with the imaging of the active contact pads 3528 or any other alignment features in the active region. FIG. 29 includes a top view of the Y-direction metrology pattern 1344 of the source die 1324 in a boundary region 1322 adjacent to still another portion of the active region 1320. The alignment marks 1444 may be 180 degrees out of phase with the active contact pads 3526 in the active region 1320, also the active region 1320 has underlying features that may interfere with the imaging of the active contact pads 3526 or any other alignment features in the active region. FIG. 30 includes a top view of the y-direction metrology pattern 1144 of the destination site in a boundary region 1122 adjacent to a further portion of the active region 1320. The alignment marks 1244 are arranged in phase with the active contact pads 3528 in the active region 1120 also the active region 1120 has underlying features that may interfere with the imaging of the active contact pads 3528 or any other alignment features in the active region.

The metrology patterns 1142, 1144, 1342 and 1344 can be dedicated metrology structures that are not electrically connected to any electrical circuit element or electrical circuit within the destination site. In this implementation, the metrology patterns 1142, 1144, 1342, and 1344 can include the alignment marks 1244 and 1444 that are arrays of dummy contact pads. In an alternative implementation, the alignment marks 1244 on the destination die are out of phase with the active contact pads 3528 of the active region 1120 of the destination die while the alignment marks 1444 of the source die are in phase with the contact pads 3526 of the active region 1320. In an alternative implementation, the alignment marks 1444 of the source die 1324 are out of phase with the alignment marks 1244 of the destination die 1020.

In any of the foregoing implementations, the metrology patterns 1142, 1144, 1342, and 1344 may lie along the bonding interface or may be an elevation spaced apart and not at the bonding interface. A destination die can include a lowest level of interconnects that may include gate electrodes and word lines, another level that includes bit lines and interconnects that are electrically connected to source regions, drain regions, gate electrodes, or a combination thereof, still another level interconnects, a further level of interconnects, and finally a level including contact pads. Due to electromagnetic radiation, parasitic coupling, or the like, the alignment marks 1244 within the destination site may be formed with a lower level of interconnects as opposed to the contact pad level. Thus, none or any one or more of the metrology patterns 1142, 1144, 1342, and 1344 may be spaced apart from and not lie along the bonding surface.

Referring to FIGS. 14, 27 and 29, portions of the source die 1324 within the zones 1452 are relatively transmissive portions, and portions of the source die 1324 within the zones 1454 are relatively non-transmissive portions due to the presence of the alignment marks 1444. Within the metrology patterns 1342 and 1344 in FIGS. 27 and 29, alignment marks 1444 correspond to the relatively non-transmissive portions and, from the top views in FIGS. 27 and 29, the portions of the metrology pattern 1342 and 1344 outside the alignment marks 1444 are relatively transmissive portions. Within the metrology patterns 1142 and 1144 in FIGS. 28 and 30, the alignment marks 1244 correspond to the relatively non-transmissive portions and, from views in FIGS. 12, 28, and 30, the portions of the silicon oxide layer 1224 within the metrology patterns 1142 and 1144 that are outside the alignment marks 1244 are relatively transmissive portions.

The difference in transmission percentages between the relatively transmissive portions and the relatively non-transmissive portions is at least 25%. In the same or different implementation, (1) no more than 25% of the radiation is transmitted through the relatively non-transmissive portions, (2) at least 75% of the radiation is transmitted through all of the relatively transmissive portions, or (3) no more than 25% of the radiation is transmitted through the relatively non-transmissive portions and at least 75% of the radiation is transmitted through all of the relatively transmissive portions.

Figure 31:
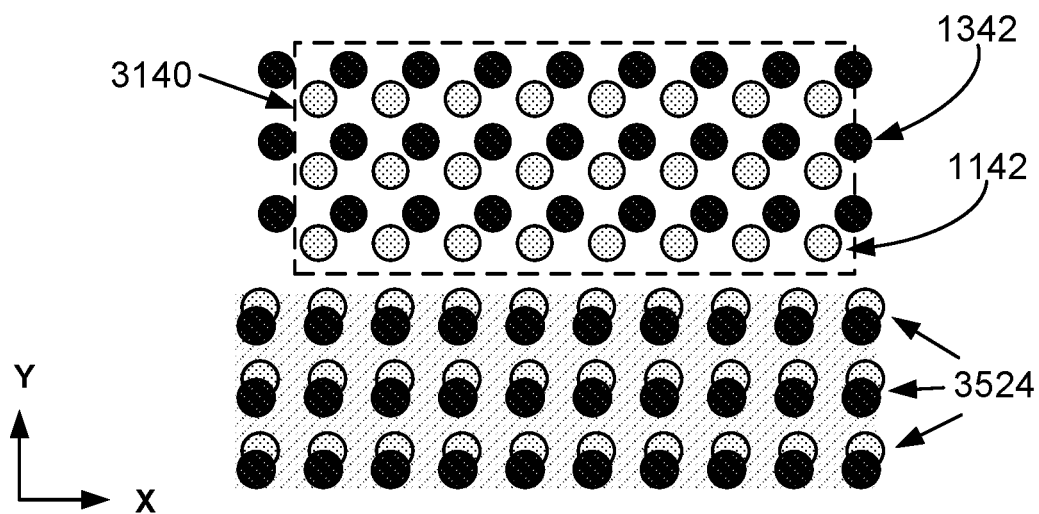
FIG. 31 includes an illustration of a radiation area and the X-direction metrology patterns of the source die and the destination site.
Figure 32:
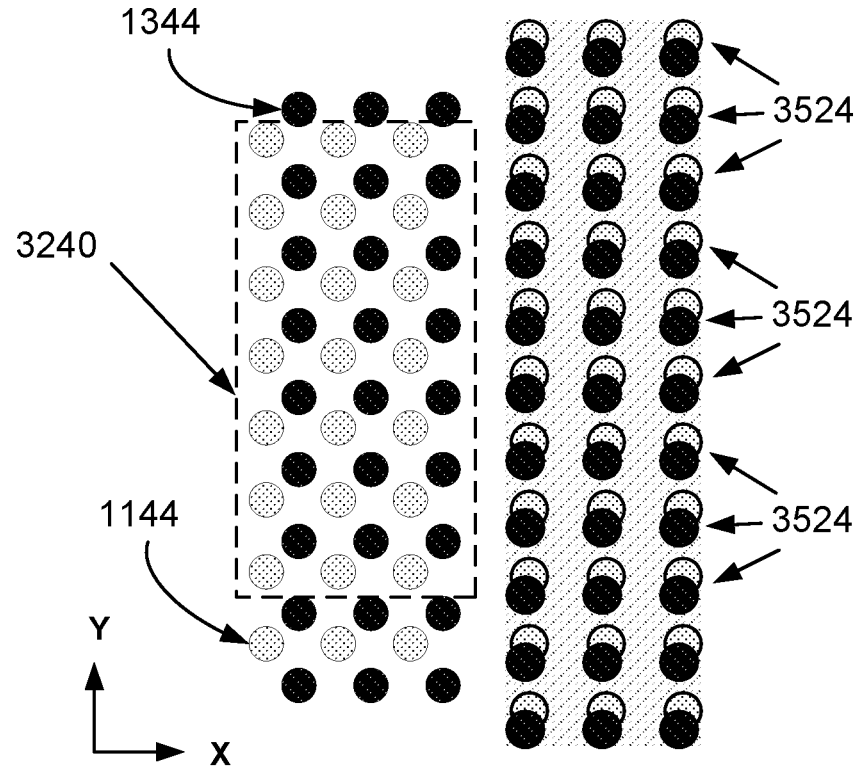
FIG. 32 includes an illustration of a radiation area and the Y-direction metrology patterns of the source die and the destination site.

FIG. 31 includes a top view of portions of the metrology patterns 1142 and 1342 after the source die 1324 is bonded to the destination site. Radiation area 3140 corresponds to the area that may be used to determine X-direction overlay error and is illustrated with a dashed line. FIG. 31 further includes portions of active regions 1120 and 1130 (labelled in FIGS. 27 and 29) that have bonded contacts 3524 each including active contact pads 3526 and 3528 (labeled in FIGS. 27 and 29). FIG. 32 includes a top view of portions of the metrology patterns 1144 and 1344 after the source die 1324 is bonded to the destination site. Radiation area 3240 corresponds to the area that may be used to determine Y-direction overlay error and is illustrated with a dashed line. FIG. 32 further includes portions of active regions 1120 and 1130 (labelled in FIGS. 28 and 30) that have bonded contacts 3524 each including active contact pads 3526 and 3528 (labelled in FIGS. 28 and 30). Radiation data collected can correspond to the radiation areas 3140 and 3240.

The metrology patterns 1142 and 1342 are designed such that the overlay error is zero when the arrays of dummy contact pads within the metrology patterns 1142 and 1342 are phase shifted by an angle of 180° relative to each other, and the arrays of dummy contact pads within the metrology patterns 1144 and 1344 are designed such that the overlay error is zero when the metrology patterns 1144 and 1344 are phase shifted by an angle of 180° relative to each other. In an implementation, the phase shift can be in a range from 90° to 270°, in a range from 150° to 210°, or another suitable range that can be useful for determining overlay error. For either or both pairs of metrology patterns in FIGS. 31 and 32, the alignment marks 1444 do not directly overlie any of the alignment marks 1244.

The phase shifting can be in one direction or in different directions. Referring to FIG. 31, the metrology patterns 1142 and 1342 have a few rows and many columns of alignment marks 1244 and 1444, and thus, the metrology patterns 1142 and 1342 are better suited for determining an X-direction overlay error as compared to a Y-direction overlay error. Referring to FIG. 32, the metrology patterns 1144 and 1344 have many rows and a few columns of alignment marks 1244 and 1444, and thus, the metrology patterns 1144 and 1344 are better suited for determining a Y-direction overlay error as compared to an X-direction overlay error.

The method can include analyzing the radiation data to determine an overlay error between the source die and the corresponding destination site at block 846 in FIG. 8. Radiation data corresponding the radiation areas 3140 and 3240 can be transmitted to the controller 160 or a local controller. The data may or may not be stored within the memory 162. The data may be transmitted outside to a processor or a memory that is external to the system 100. The data regarding radiation detected and location can be processed by the controller 160, a local controller or a computer that is external to the system 100 can be further processed to determine the overlay error. The following paragraphs describe different ways to analyze the radiation data. Each or the different ways or a combination of such ways can be used for the analysis.

An image can be generated from the radiation data. Imaging can be performed using radiation data to generate an image corresponding to the radiation area 3140, the radiation area 3240, or each of the radiation areas 3140 and 3240. Referring to FIG. 31, the radiation area 3140 may include all of the metrology pattern 1142, the metrology pattern 1342, or both or may include a portion, and not all, of either or both of the metrology patterns 1142 and 1342. The radiation area 3140 includes portions of the metrology patterns 1142 and 1342. Referring to FIG. 32, the radiation area 3240 may include all of the metrology pattern 1144, the metrology pattern 1344, or both or may include a portion, and not all, of either or both of the metrology patterns 1144 and 1344. The radiation area 3240 includes portions of the metrology patterns 1144 and 1344.

Imaging of the radiation area 3240 can be aided in view of some considerations. Imaging may be performed with the radiation detector 478 having a depth of focus that can focus on the alignment marks within the metrology patterns. The depth of focus may be at most 9 μm, at most 7 μm, or at most 5 μm. In a particular implementation, alignment marks 1244 and 1444 can be arrays of dummy contact pads that lie at the bonding surfaces of the source die 1324 and the corresponding destination site. The thickness of the dummy contact pads may be in a range from 1 μm to 4 μm. The limit on the depth of focus can reduce the likelihood of other metal or metal alloy components lying at lower elevations within the destination site, such as the interconnects 1204 and conductive plugs 1206, from being in focus. Such components may not be seen or may be blurred. The depth of focus may be adjusted to the particular thicknesses used for the alignment marks 1244 and 1444. Thus, the depth of focus may be significantly less than 9 μm or could be greater than 9 μm when no components adjacent to the metrology pattern 1142 would interfere with imaging. In the same or different implementation, the other metal or metal alloy components lying at lower elevations within the destination site may be blurred. In an alternative implementation, the depth of focus is not an issue because there are no significant features in the die to be bonded above the alignment marks, significant features below the alignment marks of the destination site, or a combination of alignment marks and the significant features. Significant features are those features within the die that would interfere with imaging alignment marks or meteorology patterns.

After an image has been generated, the controller 160, a local controller, or a computer external to the system 100 can determine an X-direction offset, a Y-direction offset, a rotational offset, or a combination thereof between the metrology patterns 1142 and 1342 within the radiation areas 3140 and 3240. Alternatively, a human operator may direct the controller 160, a local controller, or a computer external to the system 100 to use the image and measure the X-direction offset, the Y-direction offset, the rotational offset, or a combination thereof between the metrology patterns 1142 and 1342 within the radiation area 3140 and between the metrology patterns 1144 and 1344 within the radiation area 3240.

Analysis of the radiation data can be performed without generating an image. The radiation data may be collected by scanning many rows in the X-direction or many columns in the Y-direction of the radiation areas 3140 and 3240. The alignment marks 1244 and 1444 absorb, reflect, or a combination of absorb and reflect substantially more radiation as compared to locations between the alignment marks 1244 and 1444, and substantially more radiation can be transmitted between the alignment marks 1244 and 1444 as compared to through the alignment marks 1244 and 1444.

Referring to FIGS. 25 to 32, when the radiation detector 478 receives reflected radiation, the alignment marks 1244 and 1444 reflect substantially more radiation than locations where the alignment marks 1244 and 1444 are not present. In an implementation, the radiation detector 478 can output a relatively high signal when the radiation detector 478 is detecting radiation reflected by alignment marks 1244 and 1444 and can output a relatively low signal when the radiation detector 478 is detecting radiation reflected between alignment marks 1244 and 1444. For a radiation detector under the destination substrate 948, the radiation detector may detect radiation transmitted through the source die 1324 and through part or all of the destination site of the destination substrate 948 within the metrology patterns 1142 and 1144. In this implementation, the radiation detector can output a relatively low signal corresponding to the alignment marks 1244 and 1444 and, if present within the metrology patterns 1142 and 1144, the interconnects 1204 and the conductive plugs 1206 and can output a relatively high signal when the radiation detector 478 is detecting radiation transmitted between alignment marks 1244 and 1444, and, if present within the metrology patterns 1142 and 1144, the interconnects 1204 and the conductive plugs 1206. Examples described below are based on reflected radiation unless stated explicitly to the contrary.

The controller 160, a local controller, or a computer external to the system 100 can use the difference in signal amplitudes and location information to determine the sizes and locations of the alignment marks 1244 and 1444 and the pitch corresponding to the metrology patterns 1142 and 1342 within the radiation area 3140 in FIG. 31 and the sizes and locations of the alignment marks 1244 and 1444 and the pitch corresponding to the metrology patterns 1144 and 1344 within the radiation area 3240 in FIG. 32. The pitch can be a size of a feature and a space between the feature and an immediately adjacent feature in a particular direction, such as the X-direction or the Y-direction. An X-direction pitch may be the same or different from the Y-direction pitch. The features can be a pair of the alignment marks 1244 or a pair of the alignment marks 1444. As an non-limiting example, the radiation data can include scans along rows where a scan may provide a signal similar to one illustrated in FIG. 26. The scan having the widest signal for the alignment mark 2644, which is a particular alignment mark 1444, can be analyzed. Referring to FIGS. 26, for the scan, the center 2664 of signal corresponding to the alignment mark 2644 is at a particular location, such as 2.5 μm from the right-hand side of the radiation area 3140 when alignment marks 1444 have an X-direction dimension, such as a width or a diameter, of 1.0 μm and the X-direction spaces between alignment marks 1444 of 2.0 μm.

The Y-direction dimension may be obtained by identifying to which row the scan belongs. A scan may refer to one or more lines of an image obtained by a CCD or one or more lines obtained by scanning using an optical component. As a further example, Scan 0 may be along the upper border (closest to top of FIG. 31) of the radiation area 3140 and each subsequent scan is displaced in the Y-direction by 0.1 μm toward the bottom of FIG. 31 from its immediately preceding scan. The scan data in FIG. 26 may correspond to Scan 97, and thus, the center of the alignment mark is 97 scans times 0.1 μm/scan, or 9.7 μm, from the upper border of the radiation area 3140. Thus, the center of the particular alignment mark 2644 is 2.5 μm from the right-hand side of the radiation area (X-direction coordinate) and 9.7 μm from the top of the radiation area 3140 (Y-direction coordinate). The other alignment marks within the radiation areas 3140 and 3240 can be analyzed in the same way.

Referring to FIGS. 27 to 32, the controller 160, a local controller, or a computer external to the system 100 may have some information regarding the radiation areas 3140 and 3240, for example, the alternating rows or alternating columns arrangement of alignment marks 1244 and 1444. The controller 160, a local controller, or a computer external to the system 100 can use the X-direction coordinates and Y-direction coordinates for the alignment marks 1244 and 1444 to determine pitches corresponding to the alignment marks 1244 and 1444 and an overlay error based on the radiation data collected for the radiation areas 3140 and 3240.

Spatial frequency analysis may be performed on the metrology patterns 1142 and 1342 for the radiation data collected from the radiation area 3140 and on the metrology patterns 1144 and 1344 for the radiation data collected from the radiation area 3240. The spatial frequency analysis can be performed with or without images of the radiation areas 3140 and 3240. The spatial frequency analysis may be performed using value that is based on a detected pitch and feature size. The spatial frequency may be set to exclude features, such as word lines, bit lines, or other interconnects, and isolated features. In view of the foregoing, the pitch divided by the feature size is a quotient, and the value for spatial frequency analysis can be the quotient +/−10% to account for manufacturing or other variances. The value may be in a range from 1.5 to 9.0. In an alternative implementation, optical techniques may be used to blur out features that are at a plane that is not of interest.

The word lines or the bit lines may not have a pitch in one of the directions, or, when present, segmented word lines or segmented bit lines can have relatively large lengths in a direction and have relatively small spaces between the segments in that same direction. Thus, for a segmented bit line or a segmented word line, the quotient (the pitch divided by the feature size) will be less than 1.1. Isolated features may not have a pitch or have a relatively small feature size and a relatively large spaces between the isolated features. If the isolated features have a pitch, the pitch divided by feature size may exceed 10, 50, or more. Alternatively, the isolated features may vary greatly in size.

An X-direction dimension, a Y-direction dimension, or both may be as little as 1.0 μm or as large as 10 μm, 50 μm, or more. The spatial frequency analysis may include a lower limit, an upper limit, or both for the X-direction dimension, the Y-direction dimension, or both. A non-limiting example, each alignment marks 1244 and 1444 may be designed to have an X-direction dimension of 1.5 μm and a Y-direction dimension of 1.5 μm. In practice, the X-direction dimension and Y-direction dimension may vary by up to 0.2 μm due to manufacturing or other variations. Thus, the features will have X-direction dimensions and Y-direction dimensions that are in a range from 1.3 μm to 1.7 μm.

The spatial analysis may be performed only on features that meet one or more of (1) the value associated with the quotient (pitch divided by feature size), (2) feature size (X-direction dimension, Y-direction dimension, or both)), (3) another suitable criterion, or a combination thereof.

Analysis of the radiation data can include comparing an image corresponding the radiation area 3140 to a standard image corresponding to the radiation area 3140. The standard image may be an image from a different bonded source die bonded to a different destination site of a different destination substrate, where the bonded different die and different destination site has no or a relatively low overlay error. In the same or another implementation, the standard image may be a computer-generated image corresponding to zero overlay error. The computer-generated image may be based on theoretical data and not include actual radiation data from bonded dies. Similar to the radiation area 3140, analysis of the radiation data can include comparing an image corresponding to the radiation area 3240 to a standard image corresponding to the radiation area 3240.

Pattern recognition can be useful for both reflective and transmission radiation modes and can be particularly useful when radiation is transmitted through the destination substrate 948. The metrology patterns 1142 and 1144 may have other features that are close to or underlie the metrology patterns 1142 and 1144 of the destination site, such as the interconnects 1204 and conductive plugs 1206. Pattern recognition can determine that the other features are not part of the metrology patterns 1142 and 1144, and such other features may be excluded from the analysis when determining overlay error. In an implementation, there are no features that are close to or underlie the meteorology patterns in the Z-direction. Pattern recognition excludes other features that are not part of the metrology patterns 1142 and 1144.

As previously described, different techniques can be performed when analyzing the radiation data or a derivative thereof (for example, an image generated from the radiation data). The analysis can be performed using any particular technique or a combination of the techniques may be used. The analysis can continue further to determine an overlay error between the source die 1324 and its corresponding destination site.

As illustrated in FIGS. 31 and 32, the alignment marks 1244 are offset in both the X-direction and the Y-direction relative to the alignment marks 1444. The radiation data can be used to determine whether and by how much at least some of the alignment marks 1244 are from the alignment marks 1444, or by how much at least some of the alignment marks 1444 are from the alignment marks 1244. Below is a non-limiting example meant to illustrate and not limit the scope of the present invention as defined in the claims. For overlay error, X-direction positive values are closer to the right-hand sides of FIGS. 31 and 32, and Y-direction positive values are closer to the tops of FIGS. 31 and 32.

Referring to FIGS. 31 and 32, each of the alignment marks 1244 and 1444 can have a 1.0 μm diameter. In the X-direction (along a row of alignment marks), the spaces between the alignment marks 1244 is 2.0 μm, and the spaces between the alignment marks 1444 is 2.0 μm. The X-direction pitch for the alignment marks 1244 is 3.0 μm, and the X-direction pitch for the alignment marks 1444 is 3.0 μm. In the Y-direction (along a column of alignment marks), the spaces between the alignment marks 1244 is 3.0 μm, and the spaces between the alignment marks 1244 is 3.0 μm. The Y-direction pitch for the alignment marks 1244 is 4.0 μm, and the Y-direction pitch for the alignment marks 1444 is 4.0 μm.

The metrology patterns 1142, 1144, 1342 and 1344 are designed such that the alignment marks 1244 and 1444 are 180° out of phase of each other in each of the X-direction and the Y-direction when there is no overlay error. Accordingly, when the alignment marks 1244 and 1444 are 180° out of phase compared to each other, along a row of the alignment marks 1244 (X-direction), the centers of the alignment marks 1244 are 1.5 μm from each of lines defined centers of the alignment marks 1444 in immediately adjacent columns of the alignment marks 1444. Along a column of the alignment marks 1244 (Y-direction), the centers of the alignment marks 1244 are 2.0 μm from each of lines defined centers of the alignment marks 1444 in immediately adjacent rows of the alignment marks 1444.

Figure 33:
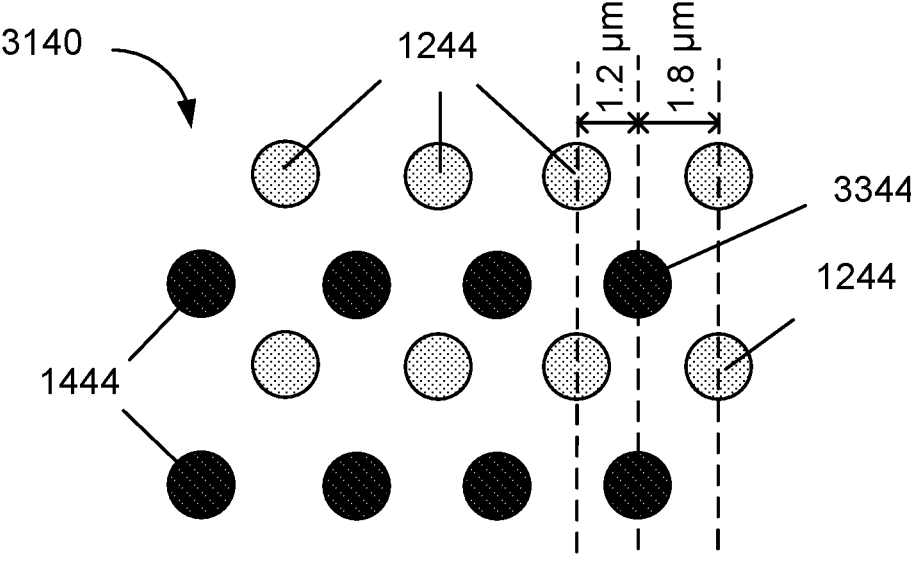
FIG. 33 includes an illustration of a portion of the radiation area of FIG. 31 and the X-direction metrology patterns of the source die and the destination site.

FIG. 33 illustrates how overlay error can be determined based on the previously described pitches and X-direction offset based on the metrology pattern 1142 and 1342. In FIG. 33, an alignment mark 3344 is a particular one of the alignment marks 1444 and used to improve understanding of how to determine an overlay error.

In the particular example, the alignment mark 3344 is 1.2 μm from the line defined by centers of the alignment marks 1244 in the column just to the left of the alignment mark 3344, and 1.8 μm from the line defined by centers of the alignment marks 1244 in the column just to the right of the alignment mark 3344. For zero overlay error, both distances would be 1.5 μm. The alignment mark 3344 is 0.3 μm closer to the left-hand side of FIG. 33 than it should be. Thus, the overlay error is −0.3 μm in the X-direction.

Figure 34:
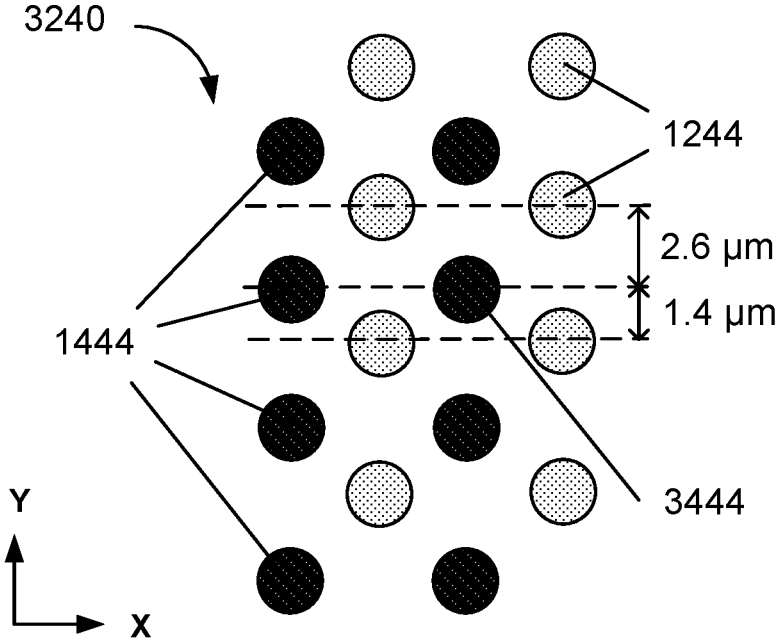
FIG. 34 includes an illustration of a portion of the radiation area of FIG. 32 and the Y-direction metrology patterns of the source die and the destination site.

FIG. 34 illustrates how overlay error can be determined based on the previously described pitches and Y-direction offset based on the metrology pattern 1144 and 1344. In FIG. 34, the alignment mark 3444 is a particular one of the alignment marks 1444 and used to improve understanding of how to determine an overlay error.

Continuing with the same example, the alignment mark 3444 is 2.6 μm from the line defined by centers of the alignment mark 1244 in the row just above the alignment mark 3444, and 1.4 μm from the line defined by centers of the alignment marks 1244 in the row just below the alignment mark 3444. For zero overlay error, both distances would be 2.0 μm. The alignment mark 3444 is 0.6 μm closer to the bottom of FIG. 34 than it should be. Thus, the overlay error is −0.6 μm in the Y-direction. The overlay error between the source die 1324 and the destination site is −0.3 μm in the X-direction and −0.6 μm in the Y-direction.

The overlay error may or may not have a rotational component. For example, the line defined by the centers of a row or column of the alignment marks 1244 should be parallel to lines defined by the centers of immediately adjacent rows or columns of the alignment marks 1444. When rotational overlay error is present, a line corresponding to the alignment marks 1244 intersects a line corresponding to the alignment marks 1444. The intersection of the lines may occur within the radiation areas 3140 and 3240 or outside one or both of the radiation areas 3140 and 3240. For this particular example, there is no rotational overlay error.

Figure 35:
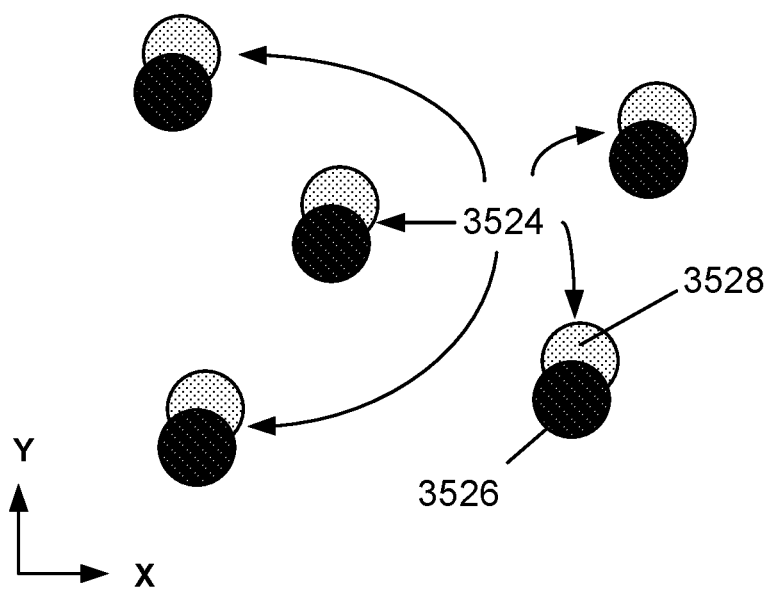
FIG. 35 includes an illustration of a top view of active contacts of a source die and a destination site of the destination substrate.

FIG. 35 includes a top view of a portion of the source die 1324 and the destination site and includes some of the bonded contacts 3524. The bonded contacts 3524 include the active contact pads 3526 of the source die 1324 and the active contact pads 3528 of the destination site. The bonded contacts 3524 correspond to connections where an electrical circuit element or an electrical circuit within the source die 1324 and is electrically connected to an electrical circuit element or an electrical circuit within the destination site. FIG. 35 confirms that the overlay error is significant and that contact resistance for the bonded contacts 3524 may to too high. The use of a bad source die and bad destination die allows the first overlay error to be determined without affecting the yield of the destination substrate 948. Alternatively, the source die 1324, the destination die, or both may be KGDs.

In an implementation, the active contact pads 3526 of source die 1324 have the same size and periodicity as the alignment marks 1444 of the source die. In an implementation, the active contact pads 3528 of destination site have the same size and periodicity as the alignment marks 1244 of the destination site. One of sets of the alignment marks 1244 and 1444 will have a different phase relative to the sets of the active contact pads 3528 and 3526 while the other set of the alignment marks 1244 and 1444 has a substantially the same phase as the sets of the active contact pads 3528 and 3526. In an implementation, the alignment marks and the active contact pads on a particular die are made using the same processes and have substantially the same patterning error.

The method can include determining an overlay error compensation based at least in part on the overlay error at block 848 in FIG. 8. Continuing with the example, the compensation to the overlay error will be for the same values but in opposite directions from the overlay error when a set of source dies are positioned relative to the destination substrate 948. Thus, with respect to the source die, the source die 1324 should have been 0.3 μm closer to the right-hand side of FIG. 25 (X-direction overlay error compensation of +0.3 μm) and 0.6 μm closer to the top of FIG. 25 (Y-direction overlay error compensation of +0.6 μm). Alternatively, the destination substrate 948 can be positioned relative to a set of source dies. With respect to the destination substrate 948, the destination substrate 948 should have been 0.3 μm closer to the left-hand side of FIG. 33 (X-direction overlay error compensation of −0.3 μm) and 0.6 μm closer to the bottom of FIG. 34 (Y-direction overlay error compensation of −0.6 μm).

When positioning the next source die or its corresponding destination site of the destination substrate 948, the next source die should be 0.3 μm closer to the right-hand side of FIG. 33 to compensate for the X-direction overlay error and 0.6 μm closer to the top of FIG. 34 to compensate for the Y-direction overlay error. The prior example included many specific details. The overlay error may be determined for a plurality of alignment marks 1444 rather than just one alignment mark.

The method includes deciding whether another set of dies is to be transferred to the destination substrate at decision diamond 862 in FIG. 8. More dies are to be transferred ("YES" branch from decision diamond 862 in FIG. 8), the method continues starting at block 544 in FIG. 5. Many details regarding the method are described above, and thus some of the details of the method are not addressed with respect to a set of dies to be transferred to the destination substrate 948.

Figure 22:
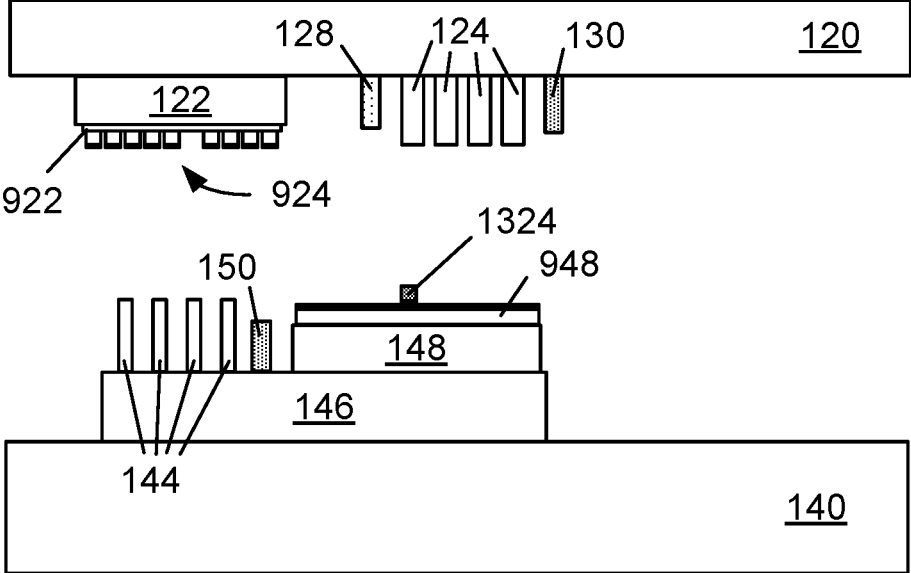
FIG. 22 includes an illustration of a cross-sectional view of the system of FIG. 21 after bonding the source die to a destination site of the destination substrate.
Figure 36:
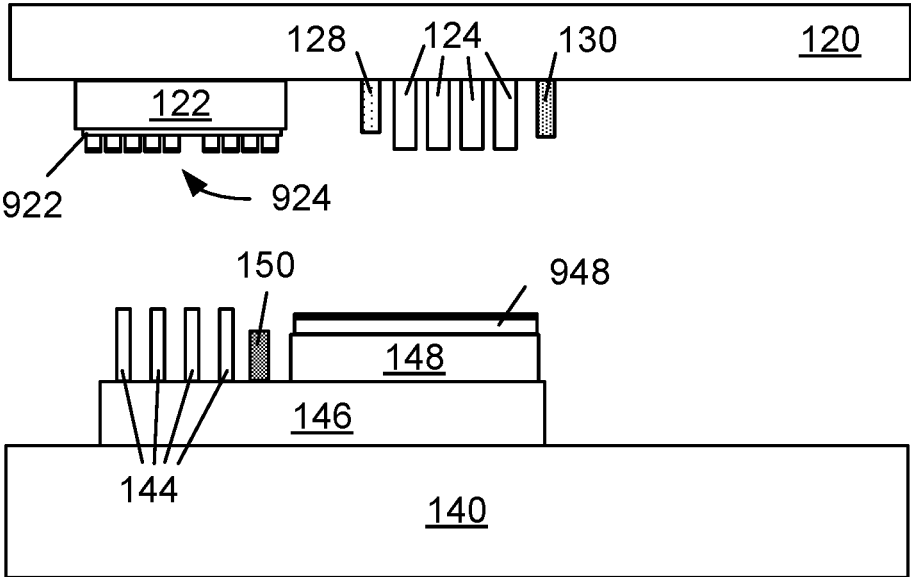
FIG. 36 includes an illustration of a cross-sectional view of the system after moving the carriage under the plurality of source dies coupled to the source substrate chuck.

The method can further include changing a pitch of the array of die transfer seats to a source-matching pitch at block 544 in FIG. 5. FIG. 36 includes a cross-sectional view of a portion of the system at this point in the process. Referring to FIGS. 22 and 23, the source die 1324 is bonded to the destination site of a bad die 1034. The cross section in FIG. 36 is along a different plane as compared to FIG. 22. The source die 1324 is present but is not illustrated in FIG. 36.

Referring to FIG. 36, the source-matching pitch can be the same or within an allowable tolerance of the source pitch. Similar to the source pitch, the source-matching pitch can include an X-direction source-matching pitch, a Y-direction source-matching pitch, or both the X-direction and Y-direction source-matching pitches. For example, the source-matching pitch can be within 2.0%, 1.0%, or 0.5% of the source pitch.

Figure 37:
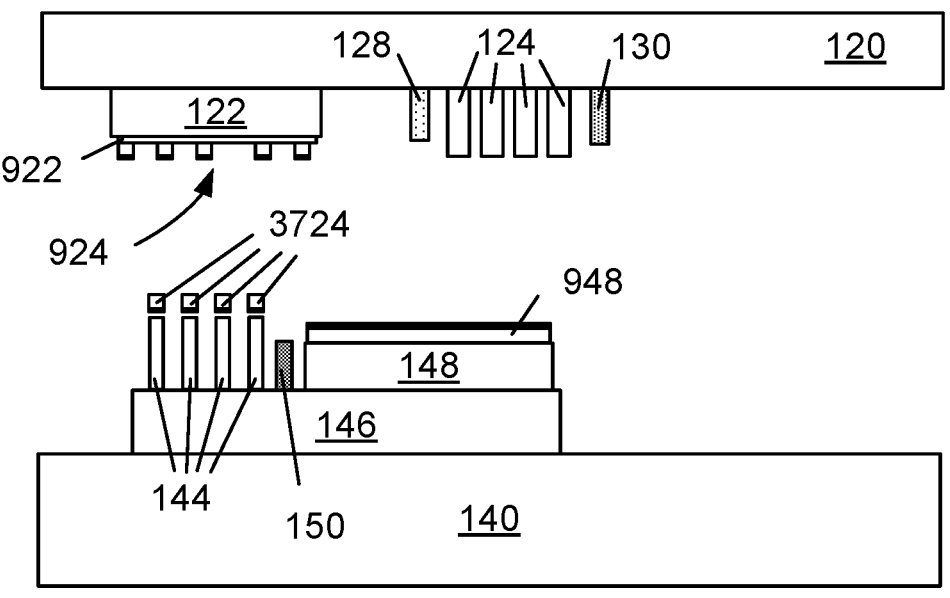
FIG. 37 includes an illustration of a cross-sectional view of the system of FIG. 36 after transferring a set of source dies to an array of die transfer seats.

The method can include loading a set of dies onto the plurality of die transfer seats at block 546 in FIG. 5. Referring to FIG. 37, die chucks of the array of die transfer seats 144 can be extended toward the source substrate 922, pick up a set of dies 3724, and retract the die chucks away from the source substrate 922. The set of dies 3724 can be a set of production source KGDs. Picking up the set of dies 3724 is a particular type of loading. Another type of loading with respect to the system 100 can be to load any or all of the die transfer seats using a die loading machine. With respect to the source substrate 922, the dies that are picked up may be dies that are closest to each other, or one or more other dies may be between the picked-up dies, such as illustrated in FIG. 37. Within the plurality of dies 924, dies not picked up remain coupled to the source substrate chuck 122 as illustrated in FIG. 37.

In an implementation, the die chucks of the array of die transfer seats 144 do not contact the activated surfaces of the set of dies 3724. Although the set of dies 3724 are held by the die chucks, the set of dies 3724 are drawn in FIG. 37 as being spaced apart from the array of die transfer seats 144 to illustrate that the activated surfaces of the dies do not contact the die transfer seats. The array of die transfer seats 144 can have a design that allows dies to be picked up along side surfaces of the dies, where the lateral side surfaces are between the device and back sides of the dies.

If dies within the set of dies are too thin to be held by their sides, backing plates can be coupled to the dies as previously described. The backing plates may or may not be removed after the set of dies 3724 are bonded to the destination substrate 948. In another implementation, the dies within the set of dies 3724 may not have activated surfaces but have relatively fragile components along surfaces that will be bonded to the destination substrate 948, and such surface should not contact a die transfer seat within the array of die transfer seats 144. A die transfer seat as described with respect to the die having the activated surface can be used for the die with a fragile component along the surface facing the die transfer seat.

In a further implementation, the die chucks for the array of die transfer seats 144 can have a design where the die chucks contact the bottom-facing surfaces of the set of dies

3724. After reading this specification in its entirety, skilled artisans will be able to determine whether the array of die transfer seats 144 should or should not contact device sides or back sides of the dies and determine a design that meets the needs or desires for a particular application.

The method can further include changing a pitch of the array of die transfer seats to a bonding head-matching pitch at block 622 in FIG. 6. The bonding head-matching pitch can be the same or within an allowable tolerance of the bonding head pitch for the array of bonding heads 124. The bonding head-matching pitch and the bonding head pitch can include an X-direction bonding head-matching pitch, a Y-direction bonding head-matching pitch, or both the X-direction and Y-direction bonding head-matching pitches. For example, the bonding head-matching pitch can be within 2.0%, 1%, or 0.5% of the bonding head pitch.

Figure 38:
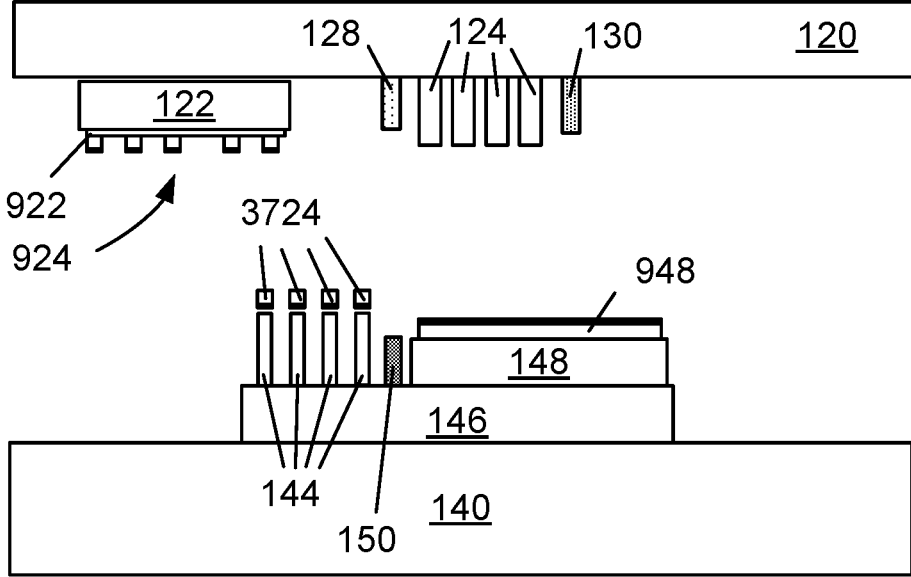
FIG. 38 includes an illustration of a cross-sectional view of the system of FIG. 37 when positioning the carriage using the optical component under the alignment reference coupled to the bridge.

The method can include moving the carriage to an alignment position at block 642 in FIG. 6. In FIG. 38, the carriage 146 is moved so that the alignment reference 128 is over the optical component 150. Information collected from the optical component 150 can be received by the controller 160 or a local controller. The controller 160 or a local controller can use the information regarding a subsequent movement of the carriage 146 to a desired location.

Figure 39:
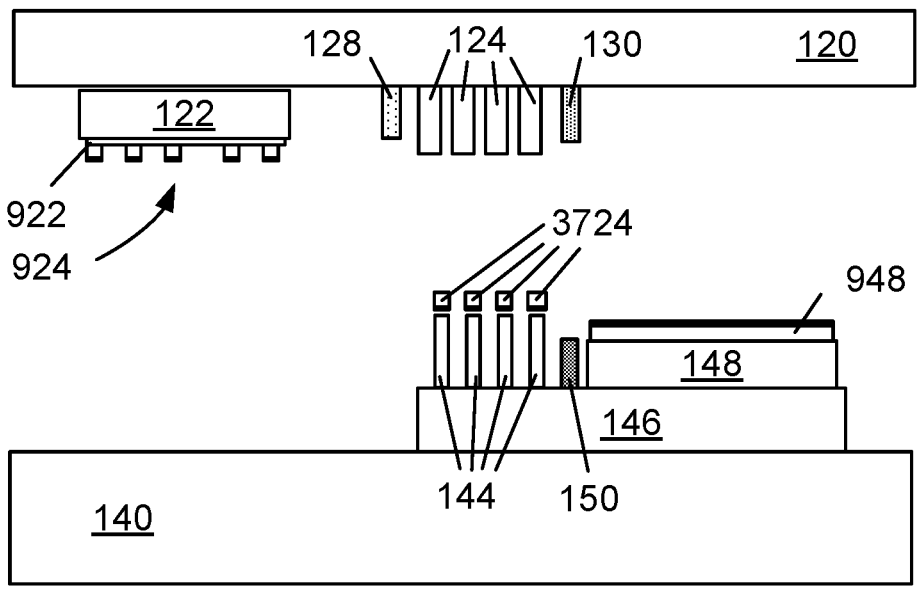
FIG. 39 includes an illustration of a cross-sectional view of the system of FIG. 38 after positioning the set of source dies under an array of bonding heads.

The method can further include moving the carriage 146 so that the set of dies 3724 can be transferred from the array of die transfer seats 144 to the array of bonding heads 124. In an implementation as illustrated in FIG. 39, the carriage 146 is moved so that the array of bonding heads 124 are over the set of dies 3724. The movement can include moving the carriage 146 in an X-direction, a Y-direction, rotating the carriage along an X-Y plane, or a combination thereof.

Figure 40:
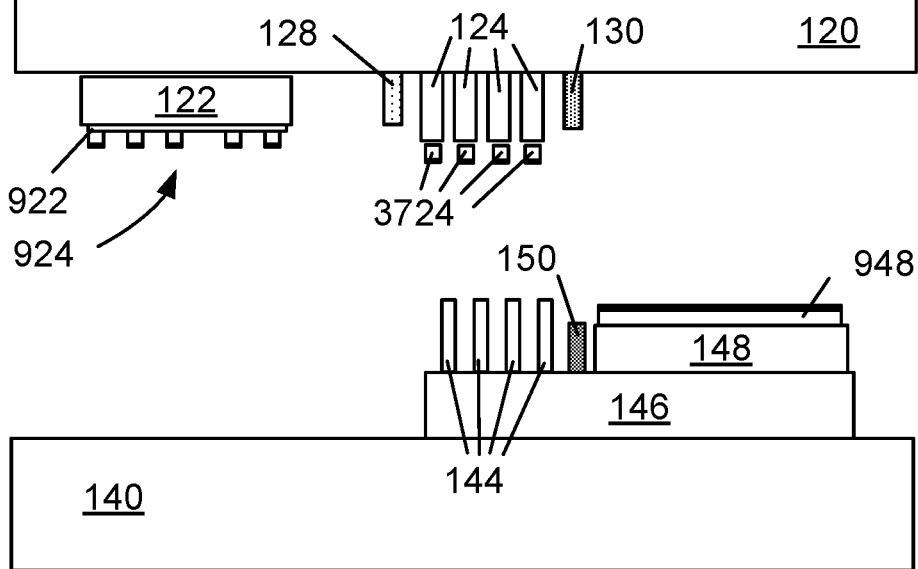
FIG. 40 includes an illustration of a cross-sectional view of the system of FIG. 39 after transferring the set of dies from the array of die transfer seats to the array of bonding heads.

The method can further include transferring the set of dies from the array of die transfer seats to the array of bonding heads at block 644 in FIG. 6. The die chucks for the array of die transfer seats 144 can be extended toward the array of bonding heads 124, the die chucks for the bonding heads within the array of bonding heads 124 can be extended toward the array of die transfer seats 144, or both. FIG. 40 includes the set of dies 3724 after transferring the set from the array of die transfer seats 144 to the array of bonding heads 124.

Figure 41:
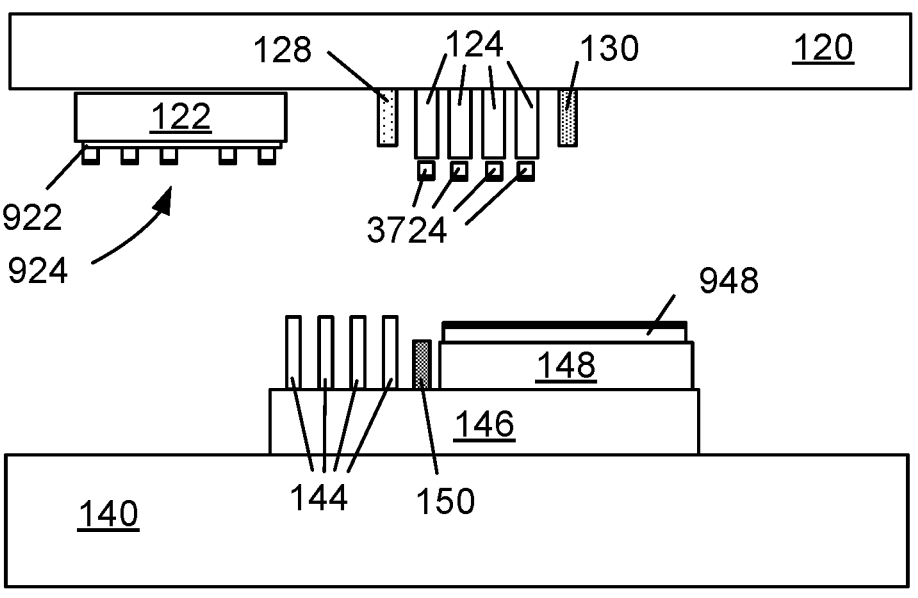
FIG. 41 includes an illustration of a cross-sectional view of the system of FIG. 40 when measuring alignment error associated with a particular source die.

The method can include measuring alignment of the set of dies using an optical component at block 662 in FIG. 6. The optical component 150 coupled to the carriage 146 may be used in positioning any one or more dies within the set of dies 3724, measuring alignment error of any one or more dies within the set of dies 3724, or both as illustrated in FIG. 41. Better positioning of the dies can be accomplished by measuring an alignment error as a position of each die on each bonding head relative to an ideal position of the die on the bonding head. Information from the optical component 150 can be sent to and received by the controller 160 or a local controller. The controller 160 or a local controller can use the information to determine an alignment error and an amount of positioning of the die so that the die will be more closely aligned to its corresponding destination site of the destination substrate 948. The controller 160 or a local controller can transmit a signal, so that the position of each die is adjusted by moving the die chuck of the bonding head using the limited range of motion of the die chuck relative to its corresponding body. Thus, in an implementation, moving the die chuck allows the position of the die to be adjusted relative to the destination substrate 948 that is held by the destination substrate chuck 148. Positioning and measuring alignment error may be performed iteratively until the alignment error is zero or an acceptably low value.

The method includes deciding whether or not to use an OEC at decision diamond 722 in FIG. 7. Overlay error and its corresponding overlay error compensation have been determined with respect to the source die 1324 and can be used for the set of dies 3724. The method proceeds along the "YES" branch at the decision diamond 722.

The method can also include adjusting a position of the set of dies or the destination site to compensate for overlay error at block 724 in FIG. 7. Adjusting the position to compensate for the overlay error may or may not be performed in addition to adjusting the position to achieve proper alignment. The adjustment compensates for the overlay error between the source die 1324 and its corresponding destination die and can allow for better electrical and physical connection between the active contact pads of the set of dies 3724 and active contact pads of the destination sites of the destination substrate 948 when the set of dies 3724 are subsequently bonded to the destination substrate 948. Ideally, the overlay error compensation completely compensates for the overlay error; however, due to manufacturing variability or differences between the source die and production source dies, the overlay error compensation may undercompensate or overcompensate for the overlay error.

Figure 43:
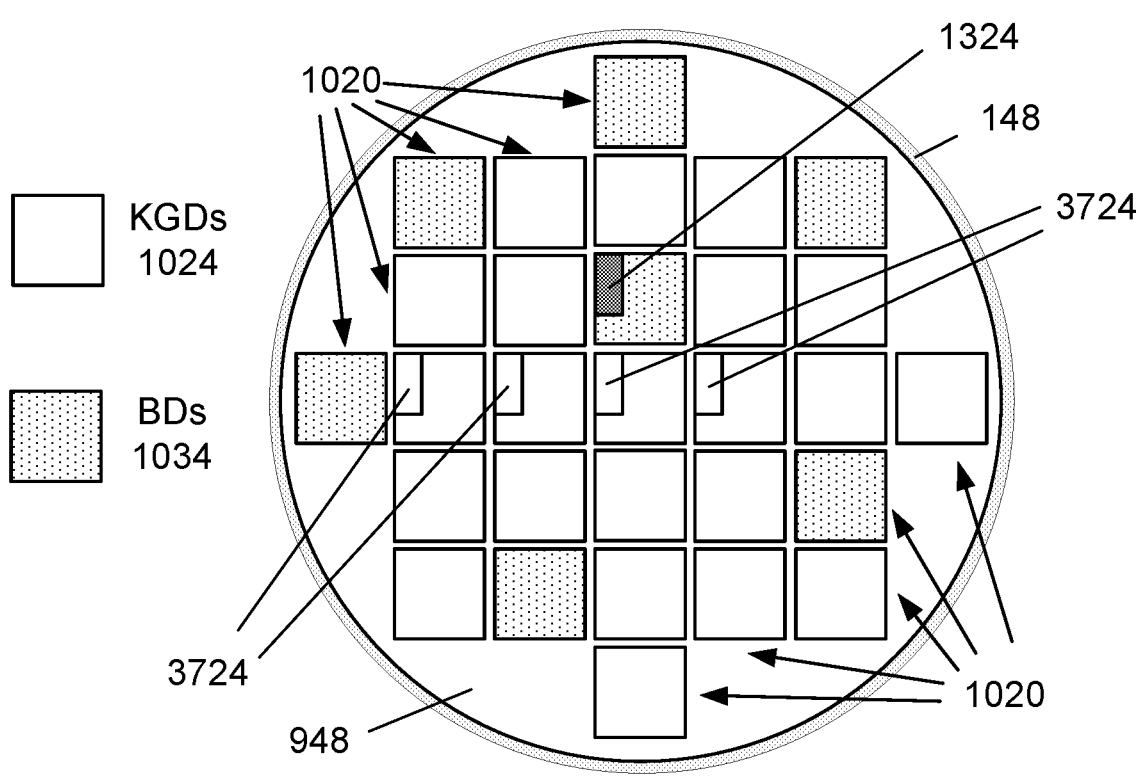
FIG. 43 includes an illustration of a top view of the destination substrate chuck and the destination substrate of the system of FIG. 42 after bonding the set of source dies to their corresponding destination sites.

With respect to positioning of dies, the overlay error compensation will be in the direction opposite of the overlay error. Regarding the particular example described with respect to FIGS. 33 and 34, the X-direction overlay error is $-0.3$ µm, and the Y-direction overlay error is $-0.6$ µm. When positioning the set of dies 3724, the X-direction overlay error compensation is $+0.3$ µm, and the Y-direction overlay error compensation is $+0.6$ µm. Before bonding, the position of the set of dies 3724 can be adjusted by moving the set of dies 3724 by $+0.3$ µm in the X-direction and $+0.6$ µm in the Y-direction. Referring briefly to FIG. 43, before bonding the source die 1324, the set of dies 3724 is moved to the right by 0.3 µm and toward the top by 0.6 µm.

In an alternative implementation, the destination substrate 948 may be positioned instead of positioning the set of dies 3724. With respect to positioning of the destination substrate 948, the overlay error compensation will be in the same direction as the overlay error. When positioning the destination substrate 948, the X-direction overlay error compensation is $-0.3$ µm, and the Y-direction overlay error compensation is $-0.6$ µm. Referring briefly to FIG. 43, before bonding the set of dies 3724, the destination substrate 948 can be moved by $-0.3$ µm in the X-direction (to the left) and $-0.6$ µm in the Y-direction (toward the bottom).

The overlay error may include a rotational component. In the example, the overlay does not include a rotational component. However, in another implementation, the overlay error may include a rotational component having an angle θ in a counterclockwise direction (−θ). When positioning the set of dies 3724, the overlay error compensation can rotate the set of dies 3724 by an angle θ in a clockwise direction (+θ). When positioning the destination substrate 948, the overlay error compensation can rotate the destination substrate 948 by an angle θ in a counterclockwise direction (−θ).

The method can be used to compensate for X-direction overlay error, Y-direction overlay error, rotational overlay error, or a combination thereof. Compensating for overlay error allows for a more accurate bonding of active contact pads between source die and destination sites of the destination substrate. Compensating for the overlay error may be performed before or after adjusting the position of the source die 1324 regarding misalignment (block 662 in FIG. 6) or moving the carriage 146 as described below with respect to block 742 in FIG. 7.

The method can include moving the carriage such that the array of bonding heads are over the destination substrate at block 742 in FIG. 7. The carriage 146 is moved so that the source die 1324 are over destination sites for the destination substrate 948.

Figure 42:
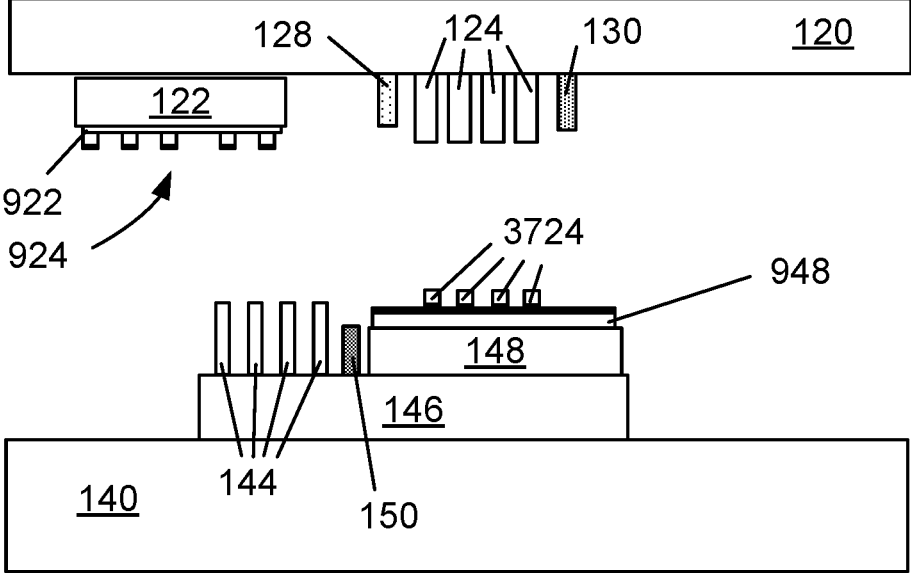
FIG. 42 includes an illustration of a cross-sectional view of the system of FIG. 41 after bonding the set of source dies to destination sites of the destination substrate.

The method can further include bonding the set of dies to the corresponding destination sites of the destination substrate at block 744 in FIG. 7. The die chucks for the array of bonding heads 124 can be extended toward the destination substrate 948, the destination substrate chuck 148 can be extended toward the array of bonding heads 124, or both. Pressure is exerted to bond the set of dies 3724 to corresponding destination sites of the destination substrate 948 in FIG. 42. In an implementation, the bonds can be oxide-to-oxide bonds. The pressure during bonding can be in a range 0.5 N/cm² to 20 N/cm². The bonding can be performed at room temperature (for example, at a temperature in a range from 20° C. to 25° C.) or higher. Bonding is performed at a temperature less than a subsequent anneal to expand conductive metal within the dies and at the destination sites. The temperature and pressure may be limited depending on films present during bonding or components within the apparatus 110. For example, the temperature may be no higher than approximately 200° C. After reading this specification, skilled artisans will be able to determine the pressure and temperature used for bonding.

FIG. 43 includes a top view of the destination substrate chuck 148 and the destination substrate 948 after the set of dies 3724 are bonded to corresponding destination sites of the destination substrate 948. The destination sites are parts of the KGDs 1024 of the destination substrate 948.

Figure 44:
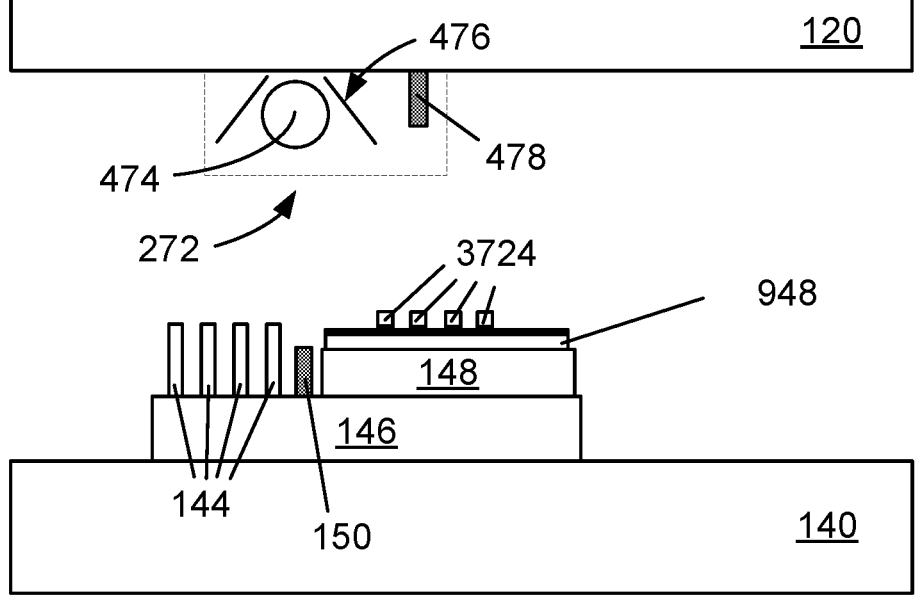
FIG. 44 includes an illustration of a cross-sectional view of the system of FIG. 42 when collecting radiation data related to the other source die and its corresponding destination site.

The method includes deciding whether or not to determine an OEC at decision diamond 762 in FIG. 7. If not ("NO" branch), the method includes deciding whether another set of dies is to be transferred to the destination substrate at decision diamond 862 in FIG. 8. If another OEC is to be determined ("YES" branch of the decision diamond 762 in FIG. 7), the method continues starting at block 842 in FIG. 8. FIG. 44 includes a cross-sectional view at this point in the method. The radiation tool 272 can be used to generate radiation data regarding the set of dies 3724. Radiation data regarding the set of dies 3724 and their corresponding destination sites can be helpful to whether the overlay error changed over time since the time of bonding the source die 1324. The change may be due to vibration or other movement of any one or combination of components within the apparatus 110, temperature change within the apparatus 110, or another environmental condition change within the apparatus 110. Further, irradiating, collecting, and analyzing radiation data regarding the set of dies 3724 can be useful to determine if the overlay error compensation completed compensated, undercompensated, or overcompensated for the overlay error associated with the source die 1324.

The method continues with irradiating metrology patterns, collecting radiation data, and analyzing the radiation as previously described with respect to blocks 842, 844, and 846.

Figure 45:
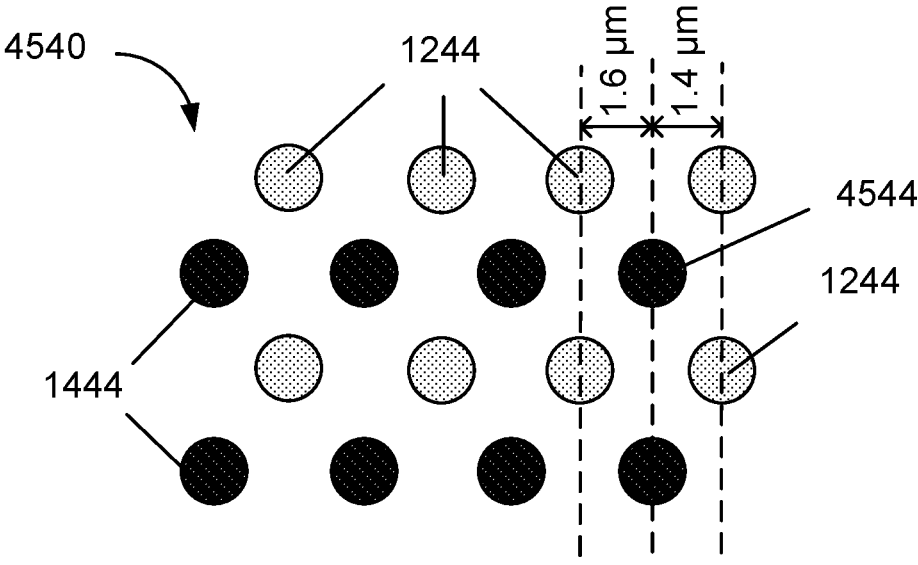
FIG. 45 includes an illustration of a portion of the radiation area for the X-direction metrology patterns of the source die and the destination site.

FIG. 45 illustrates how overlay error can be determined based on the previously described pitches and X-direction offset based on the X-direction metrology patterns for a die within the set of dies 3724 and its corresponding destination site. FIG. 45 includes a portion of a radiation area 4540. The destination site has alignment marks 1244, and the die within the set of dies 3724 has the alignment marks 1444. In FIG. 45, an alignment mark 4544 is a particular one of the alignment marks 1444 and used to improve understanding of how to determine an overlay error.

In the particular example, the alignment mark 4544 is 1.6 μm from the line defined by centers of the alignment marks 1244 in the column just to the left of the alignment mark 4544, and 1.4 μm from the line defined by centers of the alignment marks 1244 in the column just to the right of the alignment mark 4544. For zero overlay error, both distances would be 1.5 μm. The alignment mark 4544 is 0.1 μm closer to the right-hand side of FIG. 45 than it should be. Thus, the overlay error is +0.1 μm in the X-direction.

Figure 46:
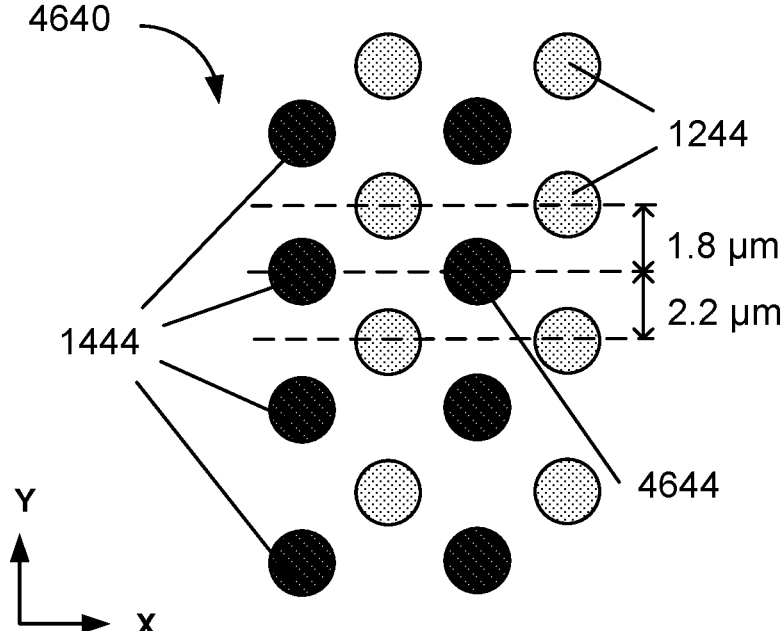
FIG. 46 includes an illustration of a portion of the radiation area for the Y-direction metrology patterns of the source die and the destination site.

FIG. 46 illustrates how overlay error can be determined based on the previously described pitches and Y-direction offset based on the Y-direction metrology patterns for a die within the set of dies 3724 and its corresponding destination site. FIG. 46 includes a portion of a radiation area 4640. In FIG. 46, an alignment mark 4644 is a particular one of the alignment marks 1444 and used to improve understanding of how to determine an overlay error.

In the particular example, the alignment mark 4644 is 1.8 μm from the line defined by centers of the alignment marks 1244 in the row just above the alignment mark 4644, and 2.2 μm from the line defined by centers of the alignment marks 1244 in the column just below the alignment mark 4644. For zero overlay error, both distances would be 2.0 μm. The alignment mark 4644 is 0.2 μm closer to the top of FIG. 43 than it should be. Thus, the overlay error is +0.2 μm in the Y-direction.

The overlay error may or may not have a rotational component as previously described. For this particular example, there is no rotational overlay error.

Figure 47:
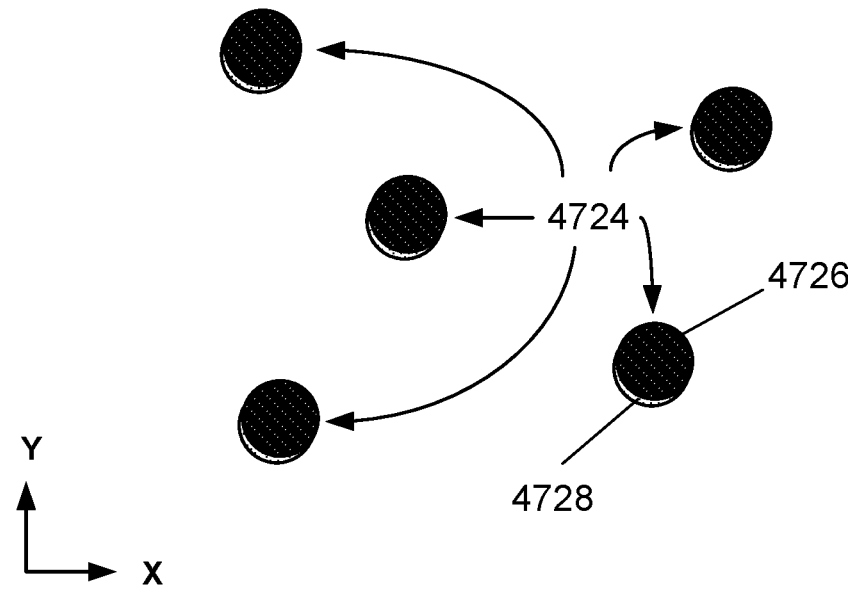
FIG. 47 includes an illustration of a top view of active contacts of a source die and a destination site of the destination substrate.

FIG. 47 includes a top view of a portion of a die within the set of dies 3724 and the destination site and includes bonded contacts 4724. The bonded contacts 4724 include active contact pads 4726 of the die within the set of dies 3724 and active contact pads 4728 of the destination site. The bonded contacts 4724 correspond to connections where an electrical circuit element or an electrical circuit within the die within the set of dies 3724 and is electrically connected to an electrical circuit element or an electrical circuit within the destination site. FIG. 47 confirms that the overlay error for the set of dies 3724 and their corresponding destination sites is substantially less than the overlay error for the source die 1324 and its corresponding destination site. The contact resistance for the bonded contacts 4724 is substantially lower as compared to the bonded contacts 3524 (FIG. 35). An electrical test can be performed to determine whether or not the active contact pads of the source dies within the set of dies 3724 and the active contact pads of the KGDs 1024 are electrically connected to each other. In this example, the test is passed.

The adjustment using the overlay error compensation based on the overlay error between the source die 1324 and its corresponding destination site overcompensated for the overlay error for the particular example. In another example with different source dies, the adjustment using the overlay error compensation can completely compensate or under-compensate for the overlay error between the different source dies and their corresponding destination sites of the destination substrate 948.

The method can include determining an overlay error compensation based at least in part on the overlay error at block 848 in FIG. 8. When more than one set of overlay errors are present, the overlay error compensation may or may not be updated in view of a new set of overlay errors.

Skilled artisans may consider the overlay error compensation that was used in positioning the set of dies 3724 and the destination site is sufficient and not update the overlay compensation error.

In a particular example, the overlay error compensation may be updated to compensate better for the overlay error associated with the set of dies 3724. The overlay error compensation used for positioning the set of dies 3724 and their corresponding destination sites of the destination substrate 948 overcompensated for the overlay error. The updated overlay compensation error may be the sum of the overlay errors. Below are equations that can be used to determine the overlay error.

For the X-direction:

$$OE_{XU} = OE_{X1} + OE_{X2} + OE_{X3} + \ldots, \text{ where}$$

$OE_{XU}$ is the updated overlay error in the X-direction,
$OE_{X1}$ is the overlay error for a first bonded die-destination site pair,
$OE_{X2}$ is the overlay error for a second bonded die-destination site pair, and
$OE_{X3}$ is the overlay error for a third bonded die-destination site pair.

For the Y-direction:

$$OE_{YU} = OE_{Y1} + OE_{Y2} + OE_{Y3} + \ldots, \text{ where}$$

$OE_{YU}$ is the updated overlay error in the Y-direction,
$OE_{Y1}$ is the overlay error for a first bonded die-destination site pair,
$OE_{Y2}$ is the overlay error for a second bonded die-destination site pair, and
$OE_{Y3}$ is the overlay error for a third bonded die-destination site pair.

More or fewer overlay error values can be used with the equations.

When using the overlay errors associated with the source die 1324 and the set of dies 3724, the updated overlay errors are:

for the X-direction:

$$OE_{XU} = OE_{X1} + OE_{X2} = (-0.3 \ \mu m) + (+0.1 \ \mu m) = -0.2 \ \mu m,$$
and for the Y-direction:

$$OE_{YU} = OE_{Y1} + OE_{Y2} = (-0.6 \ \mu m) + (+0.2 \ \mu m) = -0.4 \ \mu m,$$
where $OE_{X1}$ and $OE_{Y1}$ are the X-direction and Y-direction overlay errors associated with the source die 1324, and $+OE_{X2} + OE_{Y2}$ are the X-direction and Y-direction overlay errors associated with the die within the set of dies 3724.

The values for the X-direction and Y-direction updated overlay error compensation can depend on whether the next set of dies will be positioned or if the destination substrate 948 is positioned. If the next set of dies is positioned, the overlay error compensation will be in the directions opposite the updated overlay error. When the next set of dies is positioned, the adjustment for the updated overlay compensation error will be 0.2 μm toward the right (updated X-direction overlay composition is +0.2 μm) and 0.4 μm toward the top (updated Y-direction overlay composition is +0.4 μm). If the destination substrate 948 is positioned, the overlay error compensation will be in the same directions as the updated overlay error. When the destination substrate 948 is positioned, the adjustment for the updated overlay compensation error will be 0.2 μm toward the left (updated X-direction overlay composition is −0.2 μm) and 0.4 μm toward the bottom (updated Y-direction overlay composition is −0.4 μm).

The method includes deciding whether another set of dies is to be transferred to the destination substrate at decision diamond 862 in FIG. 8. If more dies are to be transferred ("YES" branch), the method continues starting at block 544 in FIG. 5. If no more sets of dies are to be transferred ("NO" branch), the transfer operation is completed and the method of transferring dies ends.

In the prior example, overlay error was determined for each of the source die 1324 and a die within the set of dies 3724. Overlay error may or may not be determined for each set of dies from the plurality of dies 924 bonded to the destination substrate 948. Increasing the number of overlay error determinations can help to provide more information regarding changes due to vibration or other movement of any one or combination of components within the apparatus 110, temperature change within the apparatus 110, or another environmental condition change within the appara-tus 110. The information may or may not also include whether the overlay error depends on the position where sets of dies are bonded to destination site of the destination substrate (for example, center-to-edge variation with respect to the destination substrate).

While collecting more information can be helpful, time spent irradiating metrology patterns, collecting radiation data, and potentially analyzing the radiation data, and deter-mining an overlap error compensation (blocks 842, 844, 846, and 848 in FIG. 8) may adversely affect the time elapsed for a transfer operation of dies within the plurality of dies 924 being transferred to the destination substrate 948. After reading this specification, skilled artisans will be able to determine how many times the actions in FIG. 8 are to be performed to obtain information while keeping elapsed time for a transfer operation within specification or another desired value for a particular application.

The prior example with specific numbers is provided to illustrate and improve understanding how overlay errors can be used to determine overlay error compensations and not to limit the scope of the present invention as defined in the claims.

After all desired source dies (source dies and source KGDs) are bonded to the destination substrate 948, a hybrid bonding process can continue. The hybrid bonding process can include three steps that include a bonding operation, a first anneal to cause the metal within the dies and at the destination sites to expand and contact each other, and a second anneal to cause metal atoms to cross the metal-metal interface and reduce contact resistance. The method previ-ously described can correspond to the bonding operation of a hybrid bonding process. The destination substrate 948 can be removed from the apparatus 110 or moved to a different portion of the apparatus 110 or a different tool to perform the anneal operations.

The methods as described with respect to the process flow diagrams in FIGS. 5 to 8 do not need to be performed in the order as presented in such figures. For example, mounting the destination substrate in block 522 may be performed before or after mounting the source substrate in block 524. Further, mounting the destination substrate in block 522 and mounting the source substrate in block 524 may be per-formed such that at least portions of the mounting actions are performed at the same time. Similar to blocks 522 and 524 in FIG. 5, the operations described with respect to blocks 622 (changing pitch for the die transfer seats) and 642 (moving the carriage) in FIG. 6 may be performed in either order or such that at least portions of the actions for blocks 622 and 642 are performed at the same time. As another example, determining the overlay error compensation (block 848 in FIG. 8) or both analyzing the radiation data (block 846) and determining the overlay error compensation (block 848) may be performed after determining whether another set of dies are to be bonded to the destination substrate (diamond 862) and, for the next set of dies to be bonded, as late as determining whether to use overlay error compensa-tion (diamond 722 in FIG. 7). After reading this specification skilled artisans can determine a process flow that meets the needs or desires for a particular application.

Many of the implementations described herein can help with determining an overlay error with respect to a die and a destination site of a destination substrate. A source die can be bonded to a destination site of a destination substrate. The source die can be a production source die and does not need to be a dummy source die. For the source die, interconnects or other features that would otherwise interfere with col-lecting radiation data may not be present within the metrol-ogy patterns of the source die, although such interconnects and other features may be present in the source die outside of the metrology patterns. In an implementation, alignment marks within the metrology patterns of the source die may reflect substantially more of the radiation as compared to other parts of the metrology patterns or may transmit sub-stantially less of the radiation as compared to other parts of the metrology patterns of the source die.

The radiation can be collected and analyzed. The analysis may or may not include generating an image. When an image is to be generated, further refinements may or may not be used to improve the image. The imaging may be per-formed with a range of focus that can focus on the alignment marks within the source die and the destination die and produce an image where electrical circuit elements and interconnects in the destination die are not in focus or are blurred. Pattern recognition may be used so that electrical circuit elements and interconnects below the contact pads in the destination die are not considered when determining an overlay error. Furthermore, spatial frequency analysis can also be used when imaging or when determining the overlay error.

The metrology patterns for the source die and its corre-sponding destination site can be significantly out of phase to produce a more accurate determination of overlay error. Referring to FIGS. 31 and 32, the alignment marks 1244 and 1444 do not overlap and, in the same or different imple-mentation, are nearly 180° out of phase. Compare the metrology patterns to the bonded contacts 3524 in FIG. 35 and the bonded contacts 4724 in FIG. 47. If the metrology patterns were designed to maximize overlap between the alignment marks between the metrology patterns, similar to the bonded contact pads illustrated in FIGS. 35 and 47, determining the overlay error is substantially more difficult. Many times, contact pads are made of the same material, such as Cu or Al-1 wt % Cu. Regarding FIG. 47, the peripheral edges of the contact pads 4726 that overlie the contact pads 4728 may be very difficult to detect. Thus, the out-of-phase arrangement, such as illustrated in FIGS. 31 and 32, allows for a more accurate determination of overlay error.

The overlay error obtained for the source die and its corresponding destination site may include an X-direction overlay error, a Y-direction overlay error, a rotational over-lay error, or any combination thereof. An overlay error compensation can be used for subsequent source dies, such as source KGDs, that will be bonded to the destination substrate, wherein the overlay error compensation can help to reduce the overlay error for the subsequent dies. The overlay error compensation can allow for a greater overlap between the active contact pads of source KGDs to the active contact pads at the destination sites of destination KGDs of the destination substrate. The increase in overlap between active contact pads helps to reduce contact resistance.

Overlay error for more than one source die can obtained and provide information regarding drift of the apparatus 110, whether or not there is center-to-edge variation or other positional relationship regarding overlay error with respect to where on the destination substrate the source die is bonded, or the like.

Note that not all of the activities described above in the general description or the examples are required, that a portion of a specific activity may not be required, and that one or more further activities can be performed in addition to those described. Still further, the order in which activities are listed is not necessarily the order in which they are performed.

Benefits, other advantages, and solutions to problems have been described above with regard to specific implementations. However, the benefits, advantages, solutions to problems, and any feature(s) that can cause any benefit, advantage, or solution to occur or become more pronounced are not to be construed as a critical, required, or essential feature of any or all the claims.

The specification and illustrations of the implementations described herein are intended to provide a general understanding of the structure of the various implementations. The specification and illustrations are not intended to serve as an exhaustive and comprehensive description of all of the elements and features of apparatus and systems that use the structures or methods described herein. Separate implementations can also be provided in combination in a single implementation, and conversely, various features that are, for brevity, described in the context of a single implementation, can also be provided separately or in any subcombination. Further, reference to values stated in ranges includes each and every value within that range. Many other implementations can be apparent to skilled artisans only after reading this specification. Other implementations can be used and derived from the disclosure, such that a structural substitution, logical substitution, or another change can be made without departing from the scope of the disclosure. Accordingly, the disclosure is to be regarded as illustrative rather than restrictive.

What is claimed is:

1. A method, comprising:

bonding a first source die to a first destination site of a destination substrate, wherein:

the first source die includes a first source active region and a first source boundary region, wherein the first source active region includes a first source active contact pad, and the first source boundary region includes a first source metrology pattern including a first source alignment mark, and the first destination site includes a first destination active region and a first destination boundary region, wherein the first destination active region includes a first destination active contact pad, and the first destination boundary region includes a first destination metrology pattern including a first destination alignment mark, and after bonding, the first source active contact pad contacts the first destination active contact pad;

collecting first radiation data regarding at least portions of the first source metrology pattern and the first destination metrology pattern within a first radiation area, wherein collecting the first radiation data is performed after bonding the first source die to the first destination site, and within the first radiation area, the first source alignment mark does not directly overlie or directly underlie any alignment mark of the first destination metrology pattern;

analyzing the first radiation data to determine a first overlay error between the first source die and the first destination site; and adjusting a position of a second source die or a second destination site of the destination substrate to compensate for the first overlay error between the first source die and the first destination site.

2. The method of claim 1, further comprising irradiating the first radiation area with a radiation, wherein:

the first source metrology pattern comprises a set of source alignment marks that includes the first source alignment mark, the first destination metrology pattern comprises a set of destination alignment marks, including the first destination alignment mark, and during irradiating the first radiation area, no more than 25% of the radiation is transmitted through each alignment mark of the source alignment marks and the destination alignment marks.

3. The method of claim 1, wherein irradiating the first radiation area is performed using infrared radiation.

4. The method of claim 1, wherein:

the first source metrology pattern includes a set of source alignment marks, including the first source alignment mark, along a first source bonding surface, and the first destination metrology pattern includes a set of destination alignment marks, including the first destination alignment mark, along a first destination bonding surface.

5. The method of claim 4, wherein none of the source alignment marks within the first source metrology pattern contacts any of the destination alignment marks within the first destination metrology pattern.

6. The method of claim 4, wherein:

the set of source alignment marks includes a source array of dummy contact pads, wherein the first source alignment mark is a dummy contact pad within the source array of dummy contact pads, and the first destination metrology pattern includes a destination array of dummy contact pads, wherein the first destination alignment mark is a particular dummy contact pad within the destination array of dummy contact pads.

7. The method of claim 6, wherein the source array is phase shifted by an angle in a range from 90° to 270° relative to the destination array.

8. The method of claim 4, further comprising irradiating the first radiation area with a radiation, wherein, within the first radiation area, the first source metrology pattern comprises a relatively non-transmissive portion with respect to the radiation and a relatively transmissive portion with respect to the radiation, the relatively non-transmissive portion of the first source metrology pattern includes the set of source alignment marks, the relatively transmissive portion of the first source metrology pattern is disposed between the source alignment marks, and the source alignment marks are only within the relatively non-transmissive portion, and no source alignment mark is within the relatively transmissive portion.

9. The method of claim 4, wherein analyzing comprises analyzing the first radiation data using a spatial frequency analysis.

10. The method of claim 9, wherein:
the first source metrology pattern, the first destination metrology pattern, or each of the first source metrology pattern and the first destination metrology pattern has a pitch and a size of a particular alignment mark corresponding to the pitch,
a quotient is the pitch divided by the size of the particular alignment mark corresponding to the pitch,
the pitch and the size of the particular alignment mark corresponding to the pitch corresponds to a value in a frequency domain, and
the value is the quotient +/−10% of the quotient and is in a range from 1.5 to 9.0.

11. The method of claim 1, further comprising irradiating the first radiation area with a radiation, wherein collecting radiation data is performed using a radiation detector, and wherein the radiation detector has a depth of focus of at most 9 μm.

12. The method of claim 1, wherein:
the first destination boundary region is disposed between a first dicing lane and the first destination active region, and
none of the first destination active region is disposed between the first dicing lane and the first destination boundary region.

13. The method of claim 1, further comprising:
bonding the second source die to the second destination site of the destination substrate, wherein the second source die includes a second source metrology pattern, and the second destination site includes a second destination metrology pattern, wherein the second source metrology pattern is identical to the first source metrology pattern, and the second destination metrology pattern is identical to the first destination metrology pattern;

collecting second radiation data regarding at least portions of the second source metrology pattern and the second destination metrology pattern within a second radiation area, wherein collecting the second radiation data is performed after bonding the second source die to the second destination site; and analyzing the second radiation data to determine a second overlay error between the second source die and the second destination site.

14. The method of claim 13, wherein the first overlay error is in a first direction, and the second overlay error is in a second direction that is different from the first direction.

15. The method of claim 13, wherein the first overlay error is in a first direction, and the second overlay error is in a second direction that is the same as the first direction.

16. The method of claim 13, wherein the first source die and the second source die are different source dies, and the first destination site and the second destination site are different destination sites.

17. The method of claim 16, wherein the first source die and the second source die have identical electrical circuits.

18. The method of claim 13, determining an updated overlay error that is a sum of the first overlay error and the second overlay error.

19. The method of claim 13, wherein:
the method further comprising testing a combination of the second source die and the second destination die using an electrical test to determine whether or not a second source active contact pad of the second source die and a second destination active contact pad of the second destination site are electrically connected to each other, and
the combination of the second source die and the second destination die passes the electrical test.

20. The method of claim 1, wherein the first source die is a bad source die, and the first destination site is at least part of a bad destination die.

21. The method of claim 20, wherein the second source die is a known good source die, and the second destination site is at least part of a known good destination die.

* * * * *